(12) United States Patent
Chung et al.

(10) Patent No.: US 9,793,472 B2
(45) Date of Patent: Oct. 17, 2017

(54) METHOD FOR FORMING A HARD MASK PATTERN AND METHOD FOR MANUFACTURING A SEMICONDUCTOR DEVICE USING THE SAME

(71) Applicants: Yong-Seok Chung, Seoul (KR); Yoonjong Song, Hwaseong-si (KR); Yongkyu Lee, Gwacheon-si (KR); Gwanhyeob Koh, Seoul (KR)

(72) Inventors: Yong-Seok Chung, Seoul (KR); Yoonjong Song, Hwaseong-si (KR); Yongkyu Lee, Gwacheon-si (KR); Gwanhyeob Koh, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/179,971

(22) Filed: Jun. 10, 2016

(65) Prior Publication Data

US 2017/0040531 A1 Feb. 9, 2017

(30) Foreign Application Priority Data

Aug. 6, 2015 (KR) .................. 10-2015-0111195

(51) Int. Cl.
*H01L 21/302* (2006.01)
*H01L 43/12* (2006.01)
*H01L 21/266* (2006.01)
*H01L 21/027* (2006.01)

(52) U.S. Cl.
CPC .......... *H01L 43/12* (2013.01); *H01L 21/0273* (2013.01); *H01L 21/266* (2013.01)

(58) Field of Classification Search
CPC ............. H01L 21/266; H01L 21/02642; H01L 21/0337; H01L 21/3086; H01L 21/0273; H01L 43/12
USPC ....................................... 438/3, 717
See application file for complete search history.

(56) References Cited

U.S. PATENT DOCUMENTS

| 4,496,419 A | 1/1985 | Nulman et al. |
| 5,795,814 A | 8/1998 | Tasaka |
| 2002/0132485 A1* | 9/2002 | DeOrnellas ......... H01L 21/0332 438/710 |
| 2005/0069732 A1* | 3/2005 | Kamata .................. B82Y 10/00 428/835 |
| 2005/0208742 A1 | 9/2005 | America et al. |
| 2007/0037410 A1* | 2/2007 | Chang ....................... G03F 7/40 438/780 |

(Continued)

FOREIGN PATENT DOCUMENTS

| KR | 100256810 B1 | 5/2000 |
| KR | 20070070874 A | 7/2007 |

(Continued)

*Primary Examiner* — Brook Kebede
(74) *Attorney, Agent, or Firm* — Renaissance IP Law Group LLP

(57) ABSTRACT

The inventive concepts provide a method for forming a hard mask pattern. The method includes forming a hard mask layer on an etch target layer disposed on a substrate, forming a photoresist pattern having an opening exposing one region of the hard mask layer, performing an oxygen ion implantation process on the one region using the photoresist pattern as a mask to form an oxidized portion in the one region, and patterning the hard mask layer using the oxidized portion as an etch mask.

20 Claims, 32 Drawing Sheets

(56) References Cited

U.S. PATENT DOCUMENTS

2007/0161189 A1    7/2007    Kim

FOREIGN PATENT DOCUMENTS

| KR | 20080038962 A | 5/2008 |
|----|---------------|--------|
| KR | 20110096990 A | 8/2011 |
| KR | 20160051151   | 5/2016 |

\* cited by examiner

METHOD FOR FORMING A HARD MASK PATTERN AND METHOD FOR MANUFACTURING A SEMICONDUCTOR DEVICE USING THE SAME

CROSS-REFERENCE TO RELATED APPLICATION

This U.S. non-provisional patent application claims priority under 35 U.S.C. §119 to Korean Patent Application No. 10-2015-0111195, filed on Aug. 6, 2015, in the Korean Intellectual Property Office, the disclosure of which is hereby incorporated by reference in its entirety.

BACKGROUND

Embodiments of the inventive concepts relate to a method for forming a hard mask pattern and a method for manufacturing a semiconductor device using the same. More particularly, embodiments of the inventive concepts relate to a method for forming a hard mask pattern having a fine size using a low-temperature process and a method for manufacturing a semiconductor device using the same.

Semiconductor devices are widely used in the electronic industry because of their small size, multi-functional characteristics, and/or low manufacturing costs. Semiconductor devices may include semiconductor memory devices that store logical data, semiconductor logic devices that process logical data, and hybrid devices having both the functionality of the semiconductor memory devices and the functionality of the semiconductor logic devices.

Semiconductor devices have been highly integrated as the electronics industry has developed. The highly integrated nature of the semiconductor device may cause various problems (e.g., reduction in process margin of an exposure process defining fine patterns), and thus, it may be difficult to realize highly integrated semiconductor devices. Additionally, the demand for high-speed semiconductor devices has been increasing as the electronic industry has developed. Various avenues of research are being conducted to satisfy the demands for highly integrated and/or high-speed semiconductor devices.

SUMMARY

Embodiments of the inventive concepts may provide a method for forming a hard mask pattern having a fine size by a low-temperature process.

Embodiments of the inventive concepts may also provide a method for manufacturing a semiconductor device using a hard mask pattern formed by a low-temperature process.

In one aspect, a method for forming a hard mask pattern may include forming a hard mask layer on an etch target layer that is disposed on a substrate, forming a first photoresist pattern having an opening on the hard mask layer, the opening exposing one region of the hard mask layer, performing an oxygen ion implantation process on the one region using the first photoresist pattern as a mask to form an oxidized portion in the one region, and patterning the hard mask layer using the oxidized portion as an etch mask.

In an embodiment, the hard mask layer may include at least one of aluminum (Al) or magnesium (Mg).

In an embodiment, the hard mask layer may include a metal, and the forming of the hard mask layer may include performing a physical vapor deposition (PVD) process at a temperature between about 20° C. and about 275° C.

In an embodiment, the forming method may further include forming a buffer layer between the etch target layer and the hard mask layer.

In an embodiment, a bottom surface of the oxidized portion may be substantially coplanar with a bottom surface of the hard mask layer.

In an embodiment, the oxygen ion implantation process may be performed at a temperature between about 20° C. and about 275° C.

In an embodiment, an implantation dose of the oxygen ion implantation process may range from about $1.0 \times 10^{14}/cm^2$ to about $1.0 \times 10^{16}/cm^2$.

In an embodiment, the patterning of the hard mask layer may include performing a physical sputtering etching process at a temperature between about 20° C. and about 275° C.

In an embodiment, the forming method may further include forming a spacer on an inner sidewall of the opening. In this case, the performing of the oxygen ion implantation process may include performing the oxygen ion implantation process on the one region using the first photoresist pattern and the spacer as masks to form the oxidized portion in the one region.

In an embodiment, the forming method may further include forming a second photoresist pattern having an opening on the hard mask layer, the opening exposing another region of the hard mask layer, performing an oxygen ion implantation process on the another region using the second photoresist pattern as a mask to form an oxidized portion in the another region, and patterning the hard mask layer using the oxidized portions as etch masks In another aspect, a method for forming a hard mask pattern may include forming a hard mask layer on an etch target layer that is disposed on a substrate, forming a photoresist pattern having an opening on the hard mask layer, the opening exposing one region of the hard mask layer, oxidizing the one region using the photoresist pattern as a mask to form an oxidized portion in the one region, and patterning the hard mask layer using the oxidized portion as an etch mask by a physical sputtering etching process.

In an embodiment, the hard mask layer may include a metal layer including at least one of aluminum (Al) or magnesium (Mg), and the forming of the hard mask layer may include performing a physical vapor deposition (PVD) process at a temperature between about 20° C. and about 275° C.

In an embodiment, the oxidizing of the one region may include performing an oxygen ion implantation process at a temperature between about 20° C. and about 275° C.

In an embodiment, the patterning of the hard mask layer may include performing an anisotropic etching process using an ion beam of an inert gas at a temperature between about 20° C. and about 275° C. In this case, the physical sputtering etching process may include the anisotropic etching process using the ion beam.

In still another aspect, a method for forming a hard mask pattern may include forming a hard mask layer on an etch target layer that is disposed on a substrate, forming a first photoresist pattern having a first opening on the hard mask layer, the first opening exposing a first region of the hard mask layer, oxidizing the first region using the first photoresist pattern as a mask to form an oxidized portion in the first region, forming a second photoresist pattern having a second opening on the hard mask layer, the second opening exposing a second region of the hard mask layer, oxidizing the second region using the second photoresist pattern as a mask to form an oxidized portion in the second region, and patterning the hard mask layer using the oxidized portions as etch masks. The first and second photoresist patterns may be formed using photomasks different from each other.

In an embodiment, the forming method may further include forming a mold layer covering the oxidized portion of the first region between the second photoresist pattern and the hard mask layer, and etching the mold layer using the second photoresist pattern as an etch mask to expose the second region.

In an embodiment, the oxidizing of the first region may be performed before the forming of the second photoresist pattern.

In an embodiment, each of the oxidizing of the first region and the oxidizing of the second region may include performing an oxygen ion implantation process at a temperature between about 20° C. and about 275° C.

In an embodiment, the patterning of the hard mask layer may include performing a physical sputtering etching process using the oxidized portions of the first and second regions as etch masks at a temperature between about 20° C. and about 275° C.

In yet another aspect, a method for manufacturing a semiconductor device may include forming an etch target layer including at least one of a metal or a magnetic material on a substrate, forming a hard mask pattern on the etch target layer in a temperature range between about 20° C. and about 275° C., and etching the etch target layer using the hard mask pattern as an etch mask to form a target pattern. The forming of the hard mask pattern may include forming a hard mask layer on the etch target layer, forming a photoresist pattern on the hard mask layer, forming an oxidized portion in an upper portion of a region of the hard mask layer by using the photoresist pattern as a mask, and patterning the hard mask layer using the oxidized portion as an etch mask.

In an embodiment, the forming of the etch target layer may include forming a free magnetic layer, a pinned magnetic layer, and a tunnel barrier layer disposed between the free and pinned magnetic layers. In this case, the etching of the etch target layer may include etching the free magnetic layer, the pinned magnetic layer, and the tunnel barrier layer using the hard mask pattern as the etch mask to form a magnetic tunnel junction (MTJ) pattern.

In an embodiment, the manufacturing method may further include forming a cell gate electrode on or in the substrate before the forming of the etch target layer, forming dopant regions in the substrate at both sides of the cell gate electrode, forming an interlayer insulating layer covering the cell gate electrode and the dopant regions, and forming a contact penetrating the interlayer insulating layer, the contact connected to at least one of the dopant regions. In this case, the etch target layer may be formed on the contact.

In an embodiment, the forming of the etch target layer may include forming a dielectric layer and a conductive layer which are sequentially stacked. In this case, the etching of the etch target layer may include etching the conductive layer and the dielectric layer using the hard mask pattern as the etch mask to form a gate structure.

In an embodiment, the manufacturing method may further include forming gate spacers on both sidewalls of the gate structure, and forming source/drain regions in the substrate at both sides of the gate structure.

In another aspect, a method for manufacturing a semiconductor device may comprise forming an etch target layer on a substrate in which the etch target layer comprises a free magnetic layer, a pinned magnetic layer, and a tunnel barrier layer disposed between the free and pinned magnetic layers; forming a hard mask pattern on the etch target layer by forming a hard mask layer on the etch target layer, forming a photoresist pattern on the hard mask layer, forming an oxidized portion in an upper portion of a region of the hard mask layer by using the photoresist pattern as a mask, and patterning the hard mask layer using the oxidized portion as an etch mask; and etching the etch target layer using the hard mask pattern as an etch mask to form a plurality of magnetic tunnel junction (MTJ) patterns from the free magnetic layer, the pinned magnetic layer, and the tunnel barrier layer.

In an embodiment, forming the hard mask pattern is performed in a temperature range of about 20° C. to about 275° C.

In an embodiment, the photoresist pattern comprises at least one hole formed to expose a corresponding region of the hard mask layer, the at least one hole comprising an inner sidewall, and the method may further comprise forming a spacer on the inner sidewall of the opening.

In an embodiment, forming the oxidized portion in the upper portion of the region of the hard mask layer comprises forming the oxidized portion in the region of the hard mask exposed by the at least one hole.

In an embodiment, forming the oxidized portion in the region of the hard mask exposed by the at least one hole comprises performing an oxygen ion implantation process on the region.

BRIEF DESCRIPTION OF THE DRAWINGS

The inventive concepts will become more apparent in view of the attached drawings and accompanying detailed description.

FIGS. 1A to 4A are plan views illustrating a method for forming a hard mask pattern according to embodiments of the inventive concepts.

FIGS. 1B to 4B are cross-sectional views taken along lines I-I' of FIGS. 1A to 4A, respectively.

FIGS. 7A to 9A are plan views illustrating a method for forming a hard mask pattern according to embodiments of the inventive concepts.

FIGS. 7B to 9B are cross-sectional views taken along lines I-I' of FIGS. 7A to 9A, respectively.

FIGS. 10A to 12A are plan views illustrating a method for forming a hard mask pattern according to embodiments of the inventive concepts.

FIGS. 10B to 12B are cross-sectional views taken along lines I-I' of FIGS. 10A to 12A, respectively.

FIGS. 15A to 18A are plan views illustrating a method for manufacturing a magnetic memory device according to embodiments of the inventive concepts.

FIGS. 15B to 18B are cross-sectional views taken along lines I-I' of FIGS. 15A to 18A, respectively.

FIGS. 19A to 23A are plan views illustrating a method for manufacturing a semiconductor device according to embodiments of the inventive concepts.

FIGS. 19B to 23B are cross-sectional views taken along lines I-I' of FIGS. 19A to 23A, respectively.

DETAILED DESCRIPTION OF THE EMBODIMENTS

Figure 1A:
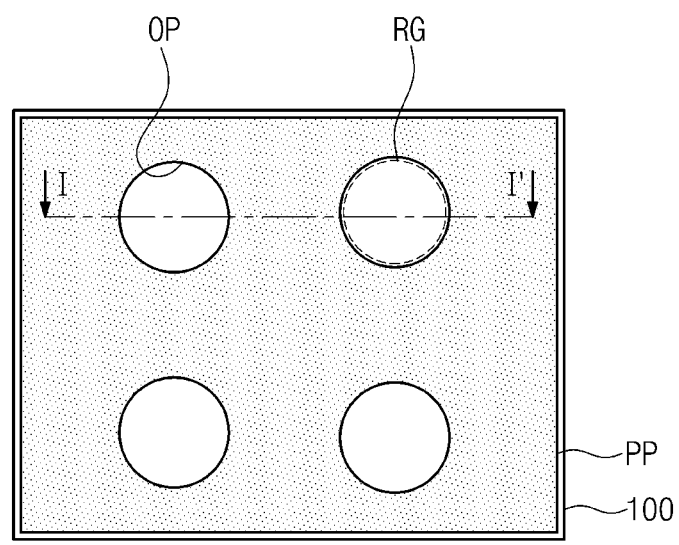

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

It will be understood that when an element such as a layer, region or substrate is referred to as being "on" another element, it can be directly on the other element or intervening elements may be present. In contrast, the term "directly" means that there are no intervening elements. In the drawings, the thicknesses of elements are exaggerated for clarity. The same reference numerals or the same reference designators denote the same elements throughout the specification.

Moreover, exemplary embodiments are described herein with reference to cross-sectional views and/or plan views that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments. It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

FIGS. 1A to 4A are plan views illustrating a method for forming a hard mask pattern according to embodiments of the inventive concepts. FIGS. 1B to 4B are cross-sectional views taken along lines I-I' of FIGS. 1A to 4A, respectively.

Figure 1B:
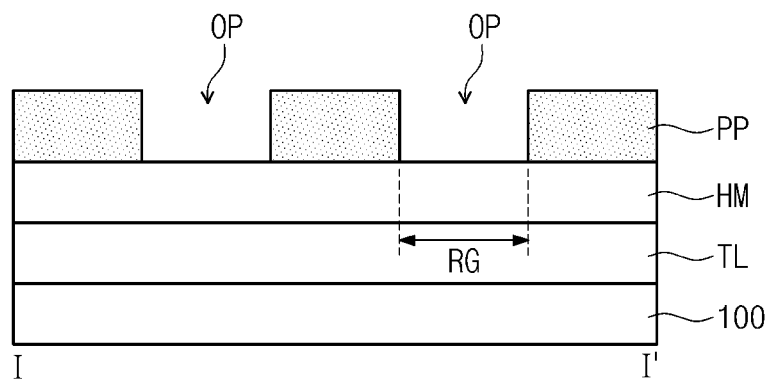

Referring to FIGS. 1A and 1B, an etch target layer TL may be formed on a substrate 100. The substrate 100 may be a semiconductor substrate that includes silicon, germanium, or silicon-germanium or may be a compound semiconductor substrate. The etch target layer TL may include a material that melts or deteriorates at about 300° C. or greater. For example, the etch target layer TL may include at least one of a metal or a magnetic material. The etch target layer TL will be described later in more detail.

A hard mask layer HM may be formed on the etch target layer TL. The hard mask layer HM may be formed using a physical vapor deposition (PVD) process at a relatively low temperature between about 20° C. and about 275° C. For example, the PVD process may include a sputtering process or a filtered vacuum arc process. The hard mask layer HM may include a material that has an etch selectivity with respect to the etch target layer TL and that is easily oxidized at a low temperature. In an embodiment, the hard mask layer HM may be a metal layer including at least one of aluminum (Al) or magnesium (Mg).

A photoresist pattern PP may be formed on the hard mask layer HM. In detail, a photoresist layer may be formed on the hard mask layer HM, and an exposure process and a development process may be sequentially performed on the photoresist layer to form the photoresist pattern PP. The photoresist pattern PP may include openings OP that expose specific regions RG of the hard mask layer HM, respectively. In other words, top surfaces of the specific regions RG may be exposed through the openings OP. Each of the openings OP may have a circular shape, a quadrilateral shape, a polygonal shape, or a linear shape when viewed in a plan view. However, embodiments of the inventive concepts are not limited thereto and may have other shapes.

Figure 2A:
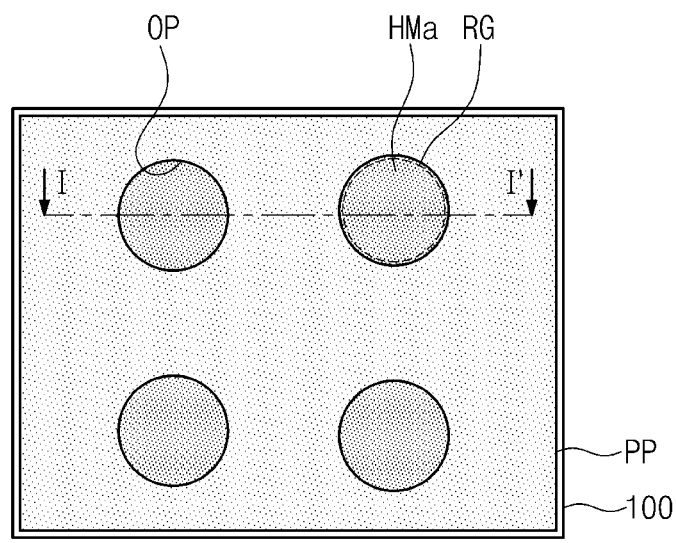
Figure 2B:
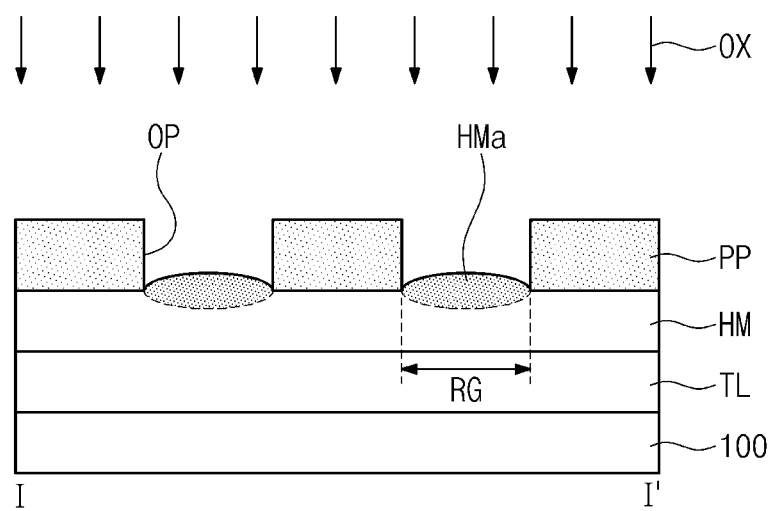

Referring to FIGS. 2A and 2B, the specific regions RG exposed through the openings OP may be oxidized to form oxidized portions HMa in the specific regions RG. In detail, an oxidation source OX may be selectively provided to the specific regions RG using the photoresist pattern PP as a mask. Upper portions of the specific regions RG may be oxidized by the oxidation source OX. If the hard mask layer HM includes aluminum (Al) or magnesium (Mg), the oxidized portions HMa may include aluminum oxide (AlO) or magnesium oxide (MgO).

In an embodiment, providing the oxidation source OX may include performing an oxygen ion implantation process. In such a situation, the oxidation source OX may be oxygen ions formed from oxygen ($O_2$) and/or ozone ($O_3$). The oxygen ion implantation process may be performed at a low temperature of about 20° C. to about 275° C. The oxygen ions may be implanted at an implantation dose of about $1.0 \times 10^{14}/cm^2$ to about $1.0 \times 10^{16}/cm^2$.

In an embodiment, providing the oxidation source OX may include performing an oxidation process using plasma in which case the oxidation source OX may be plasma of at least one of oxygen ($O_2$), ozone ($O_3$), or water vapor ($H_2O$).

The oxidation process using an oxygen ion implantation process may be performed at a relatively low temperature as compared with an oxidation process using the plasma. In other words, the process temperature of an oxidation process using the oxygen ion implantation process may be lower than that of an oxidation process using the plasma. Thus, when the etch target layer TL includes a material (e.g., a metal or a magnetic material) that is relatively sensitive to a high temperature, an oxygen ion implantation process may be used.

Figure 3A:
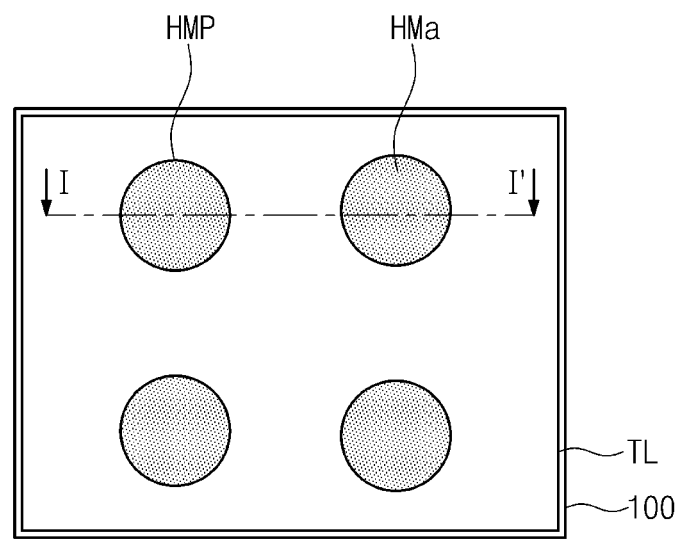
Figure 3B:
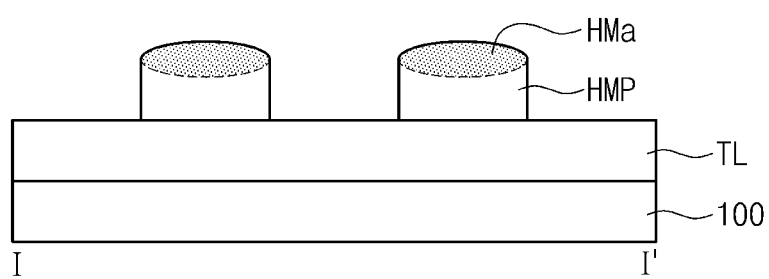

Referring to FIGS. 3A and 3B, the photoresist pattern PP may be removed. Subsequently, the hard mask layer HM may be patterned or etched using the oxidized portions HMa as etch masks to form hard mask patterns HMP.

In an embodiment, patterning the hard mask layer HM may use a physical sputtering etching process. A physical strength of the oxidized portions HMa may be greater than that of the hard mask layer HM that is not oxidized. Thus, the oxidized portions HMa may have an etch selectivity with respect to the hard mask layer HM in a physical sputtering etching process. A physical sputtering etching process may include an anisotropic etching process that is performed using an ion beam of an inert gas at a temperature between about 20° C. and about 275° C. The inert gas may be ionized to generate plasma, and ions of the inert gas may be collided with the hard mask layer HM to etch or pattern the hard mask layer HM. The inert gas may include at least one of helium (He), neon (Ne), argon (Ar), krypton (Kr), xenon (Xe), or radon (Rn).

In an embodiment, patterning the hard mask layer HM may use a chemical etching process, e.g., a reactive ion etching (RIE) process. When a specific etching gas (e.g., $CF_4$ and/or $SiCl_4$) is used, the oxidized portions HMa may have an etch selectivity with respect to the hard mask layer HM that is not oxidized. Thus, the hard mask layer HM may be patterned by an anisotropic RIE process, thereby forming the hard mask patterns HMP.

A physical sputtering etching process may be performed at a relatively low temperature as compared with an RIE process. In other words, the process temperature of a physical sputtering etching process may be lower than the process temperature of an RIE process. Thus, when the etch target layer TL includes a material (e.g., a metal or a magnetic material) that is relatively sensitive to a high temperature, a physical sputtering etching process may be used.

Figure 4A:
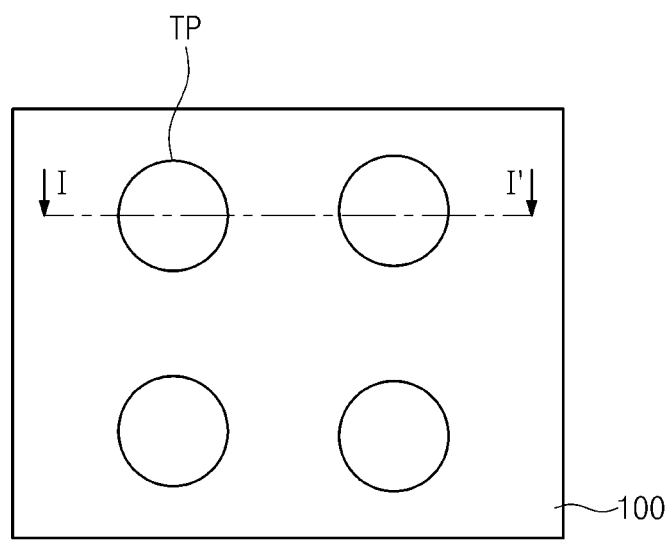
Figure 4B:
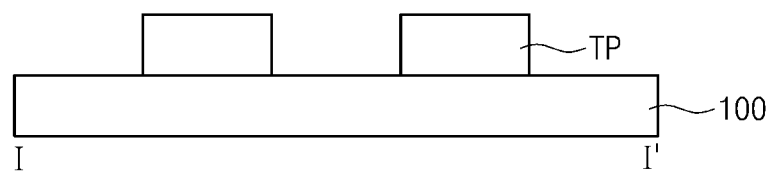

Referring to FIGS. 4A and 4B, the etch target layer TL may be etched using the hard mask patterns HMP as etch masks to form target patterns TP. Remaining hard mask patterns HMP may be removed after etching the etch target layer TL. The process of etching the etch target layer TL may be a dry etching process, and an etching gas used in the dry etching process may be suitably selected depending on a kind of the material that is used for the etch target layer TL.

Hard mask patterns HMP having fine sizes may be required to realize target patterns TP having fine sizes. According to embodiments of the inventive concepts, fine regions of the hard mask layer HM may be selectively oxidized using the openings OP of the photoresist pattern PP. Thus, it is possible to effectively form the hard mask patterns HMP having fine sizes and the fine target patterns TP disposed thereunder.

Additionally, the method for forming the hard mask patterns HMP according to the above embodiment may be performed at a low temperature between, for example, about 20° C. and about 275° C. Thus, it is possible to reduce or minimize characteristic deterioration of the etch target layer TL disposed under the hard mask patterns HMP and/or characteristic deterioration of other semiconductor components.

Figure 5:
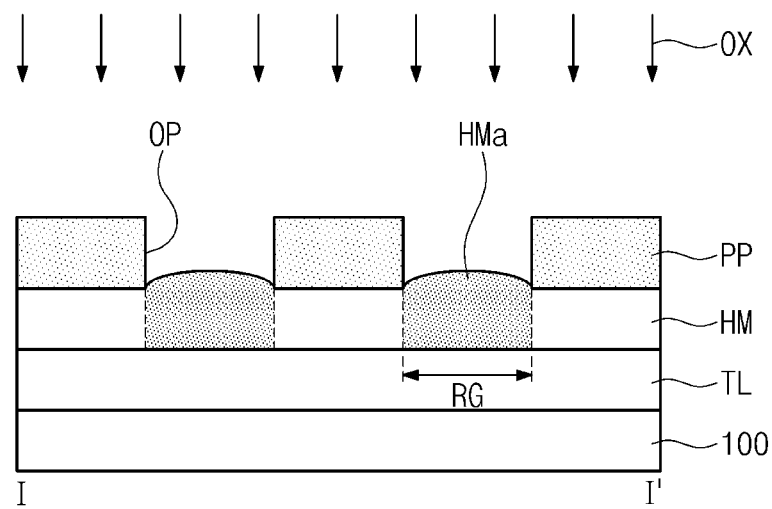
FIGS. 5 and 6 are cross-sectional views taken along lines I-I' of FIGS. 2A and 3A, respectively, to illustrate a method for forming a hard mask pattern according to embodiments of the inventive concepts.
Figure 6:
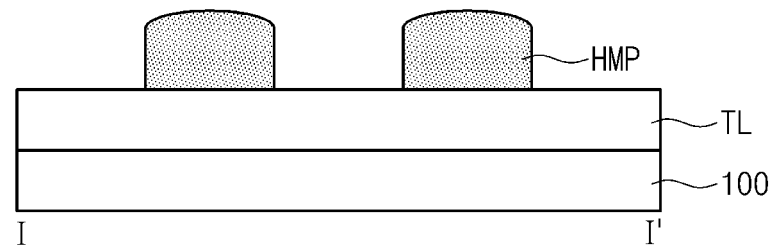

FIGS. 5 and 6 are cross-sectional views taken along lines I-I' of FIGS. 2A and 3A, respectively, to illustrate a method for forming a hard mask pattern according to embodiments of the inventive concepts. In the present embodiment, the descriptions about the same technical features as in the embodiment of FIGS. 1A to 4A and 1B to 4B will be omitted or only mentioned briefly for the purpose of ease and convenience in explanation.

Referring to FIGS. 2A and 5, an oxidation source OX may be provided to the resultant structure of FIGS. 1A and 1B to respectively form oxidized portions HMa in the specific regions RG of the hard mask layer HM. In such a situation unlike in FIG. 2B, an entire portion of the specific region RG may be converted or formed into the oxidized portion HMa. In other words, an oxygen ion implantation process or a plasma oxidation process may be performed until the specific regions RG are completely oxidized. For example, bottom surfaces of the oxidized portions HMa may be substantially coplanar with a bottom surface of the hard mask layer HM.

Referring to FIGS. 3A and 6, the hard mask layer HM that is not oxidized may be removed except for the oxidized portions HMa. The removal of the hard mask layer HM may be performed using an etch selectivity between the oxidized portion HMa and the unoxidized hard mask layer HM. As a result, hard mask patterns HMP may be formed. The hard mask patterns HMP may correspond to the oxidized portions HMa remaining after the removal of the unoxidized hard mask layer HM.

FIGS. 7A to 9A are plan views illustrating a method for forming a hard mask pattern according to embodiments of the inventive concepts. FIGS. 7B to 9B are cross-sectional views taken along lines I-I' of FIGS. 7A to 9A, respectively. In the present embodiment, the descriptions about the same technical features as in the embodiment of FIGS. 1A to 4A and 1B to 4B will be omitted or only mentioned briefly for the purpose of ease and convenience in explanation.

Figure 7A:
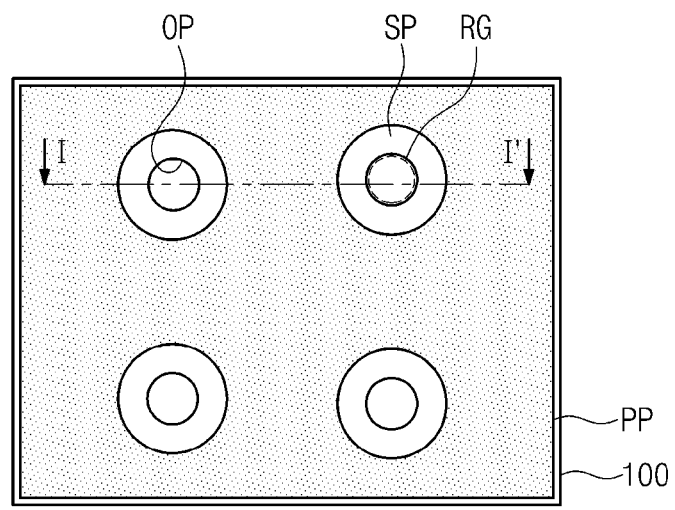
Figure 7B:
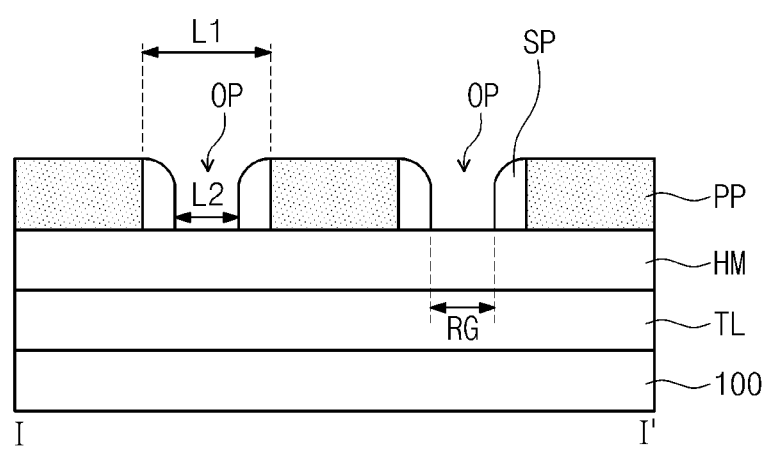

Referring to FIGS. 7A and 7B, spacers SP may be formed to partially fill the respective openings OP of the photoresist pattern PP. Forming the spacers SP may include conformally forming a spacer layer covering the photoresist pattern PP, which has the openings OP, and anisotropically etching the spacer layer to form the spacers SP covering inner sidewalls of the respective openings OP. A width of the opening OP before the formation of the spacer SP may correspond to a first length L1, such as the width of the opening OP shown in FIG. 1B. A width of the opening OP after the formation of the spacer SP may correspond to a second length L2. In such a situation, the second length L2 may be shorter than the first length L1. Specific regions RG of the hard mask layer HM may be exposed by the spacers SP and the photoresist pattern PP. In other words, the specific regions RG may be exposed through the openings OP having the spacers SP.

Figure 8A:
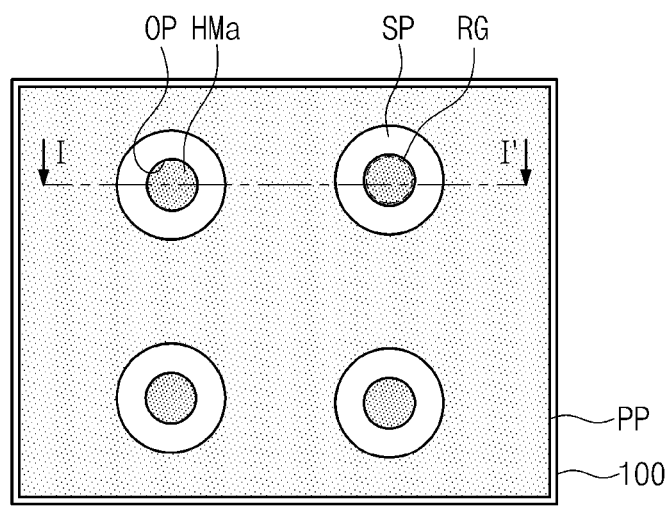
Figure 8B:
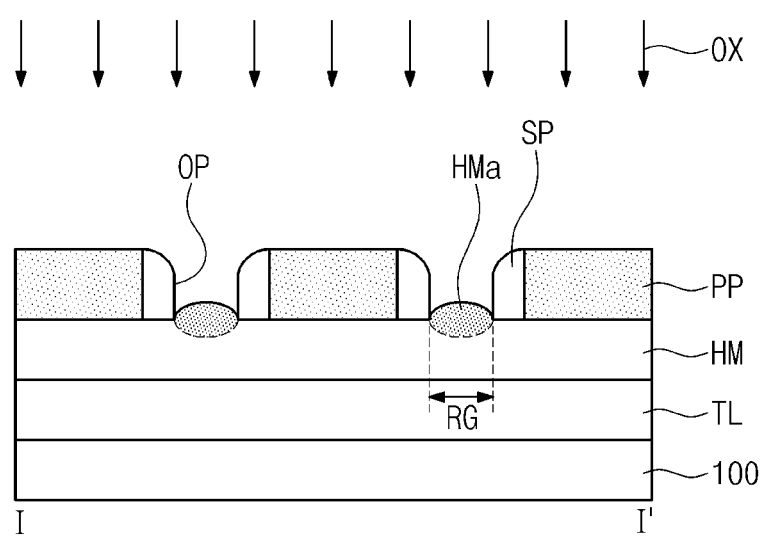

Referring to FIGS. 8A and 8B, the specific regions RG exposed through the openings OP having the spacers SP may be selectively oxidized to form oxidized portions HMa in the respective specific regions RG. Oxidizing the specific regions RG may include providing the oxidation source OX using an oxygen ion implantation process or a plasma oxidation process. In this situation, due to the spacers SP, widths of the oxidized portions HMa of FIGS. 8A and 8B may be smaller than the widths of the oxidized portions HMa of FIGS. 2A and 2B.

Figure 9A:
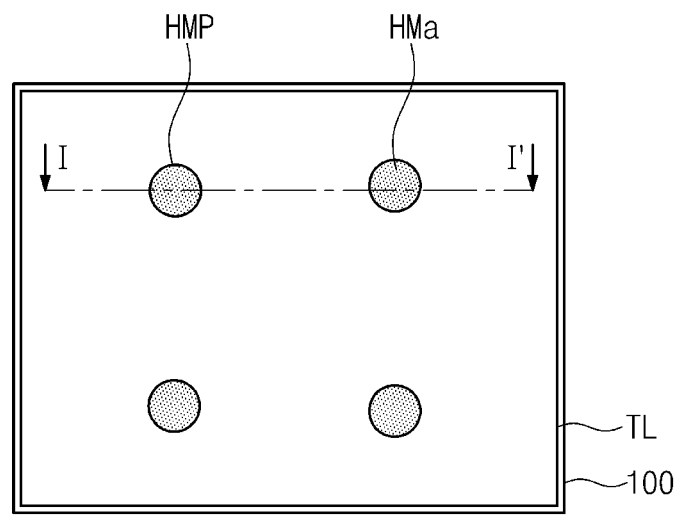
Figure 9B:
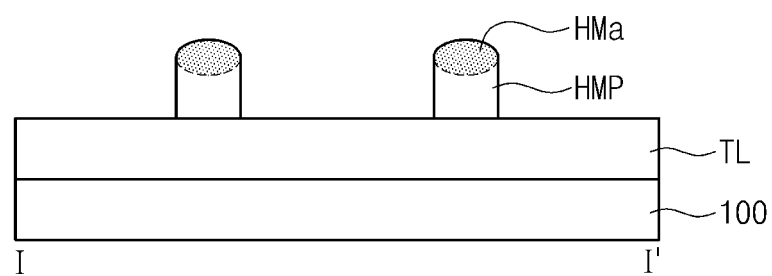

Referring to FIGS. 9A and 9B, the hard mask layer HM may be patterned using the oxidized portions HMa as etch masks to form hard mask patterns HMP. Forming the hard mask patterns HMP may be performed using a physical sputtering etching process or an RIE process. According to the present embodiment, since the spacers SP are formed in the openings OP of the photoresist pattern PP, sizes of the hard mask patterns HMP may be effectively reduced.

FIGS. 10A to 12A are plan views illustrating a method for forming a hard mask pattern according to embodiments of the inventive concepts. FIGS. 10B to 12B are cross-sectional views taken along lines I-I' of FIGS. 10A to 12A, respectively. In the present embodiment, the descriptions about the same technical features as in the embodiment of FIGS. 1A to 4A and 1B to 4B will be omitted or only mentioned briefly for the purpose of ease and convenience in explanation.

Figure 10A:
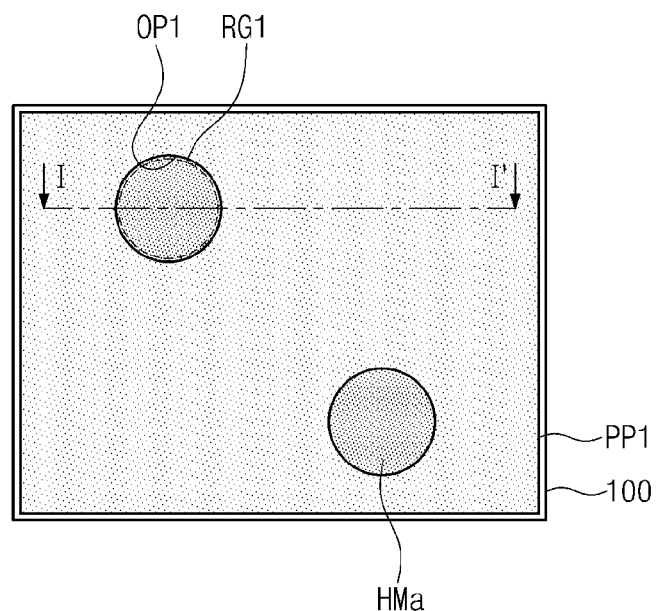
Figure 10B:
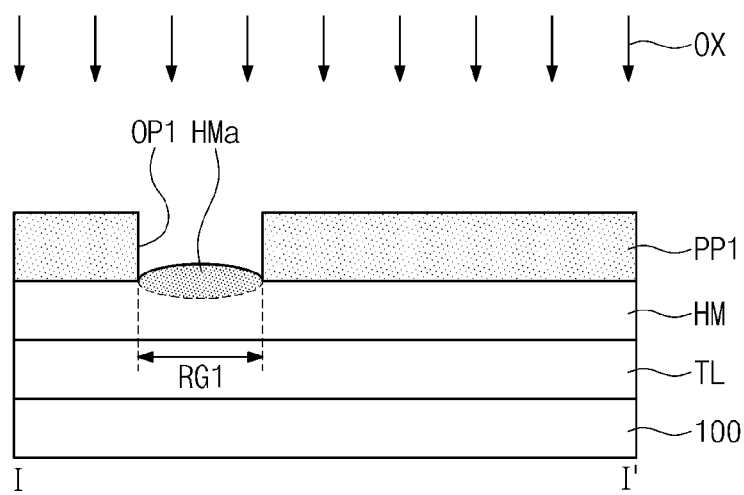

Referring to FIGS. 10A and 10B, a first photoresist pattern PP1 having first openings OP1 may be formed on a hard mask layer HM. The first openings OP1 may respectively expose first specific regions RG1 of the hard mask layer HM. The first specific regions RG1 exposed by the first openings OP1 may be selectively oxidized to form oxidized portions HMa on the respective first specific regions RG1.

Figure 11A:
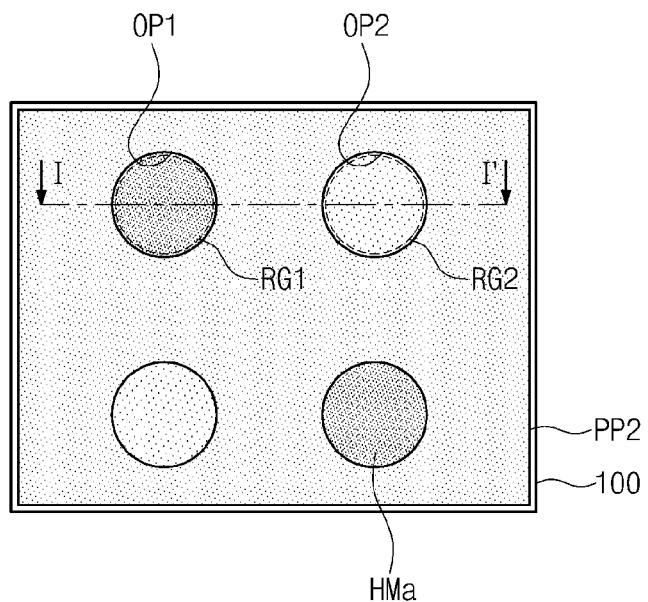
Figure 11B:
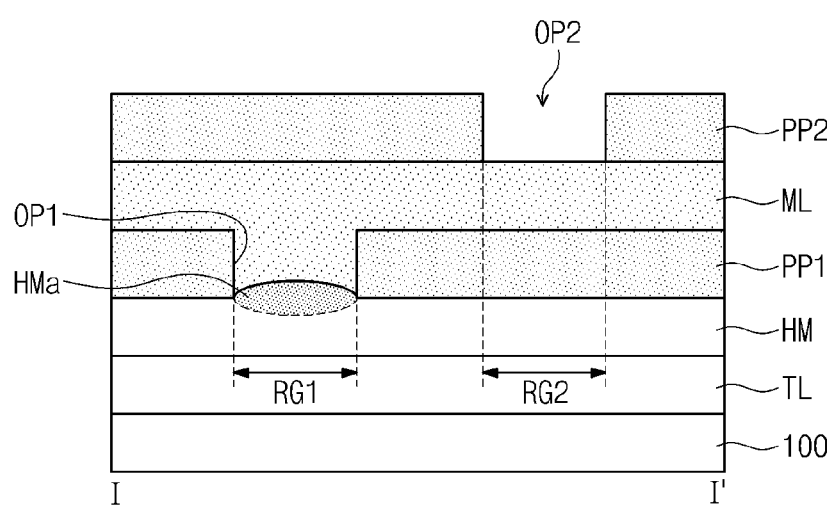

Referring to FIGS. 11A and 11B, a mold layer ML may be formed on the first photoresist pattern PP1. The mold layer ML may cover the oxidized portions HMa of the first specific regions RG1. For example, the mold layer ML may be formed of at least one of an amorphous carbon layer (ACL), a spin-on-hardmask (SOH) layer, or a spin-on-dielectric (SOD) layer.

A second photoresist pattern PP2 having second openings OP2 may be formed on the mold layer ML. The second openings OP2 may respectively expose portions of a top surface of the mold layer ML. The second openings OP2 may vertically overlap with respective second specific regions RG2 of the hard mask layer HM.

Figure 12A:
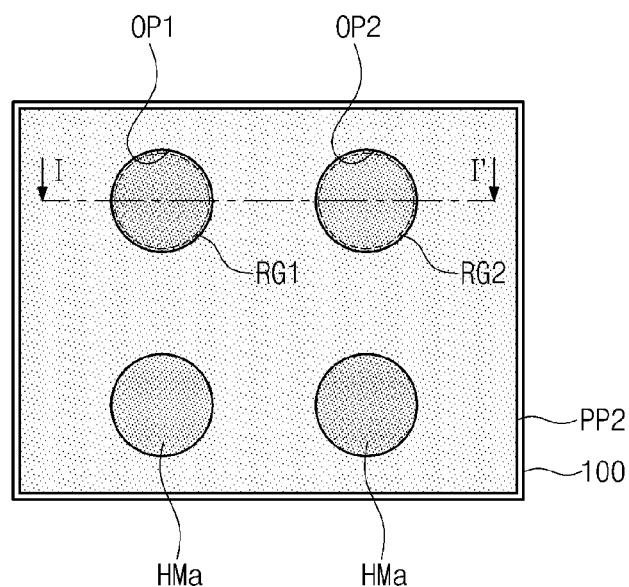
Figure 12B:
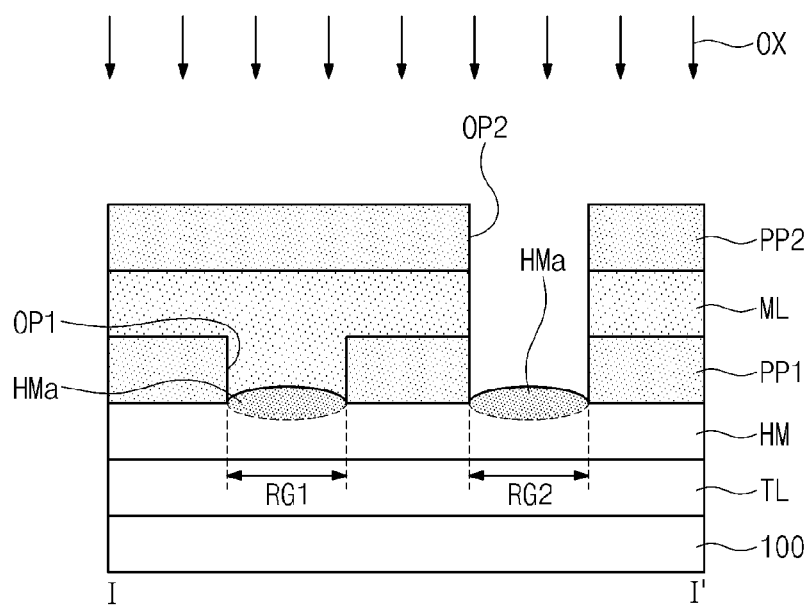

Referring to FIGS. 12A and 12B, the mold layer ML and the first photoresist pattern PP1 may be etched using the second photoresist pattern PP2 as an etch mask to expose the second specific regions RG2. The second specific regions RG2 exposed through the second openings OP2 may be selectively oxidized to form oxidized portions HMa on the respective second specific regions RG2.

Referring again to FIGS. 3A and 3B, the first and second photoresist patterns PP1 and PP2 and the mold layer ML may be removed. Next, the hard mask layer HM may be patterned using the oxidized portions HMa as etch masks to form hard mask patterns HMP.

If a distance between the hard mask patterns HMP is very small, it may be difficult to form the hard mask patterns HMP by one photoresist pattern formed using one photomask. This may be because of a resolution limitation of a photolithography process. However, according to the present embodiment, the first and second photoresist patterns PP1 and PP2 may be formed using photomasks that are different from each other. Thus, it is possible to form the hard mask patterns HMP arranged at a fine pitch.

Figure 13:
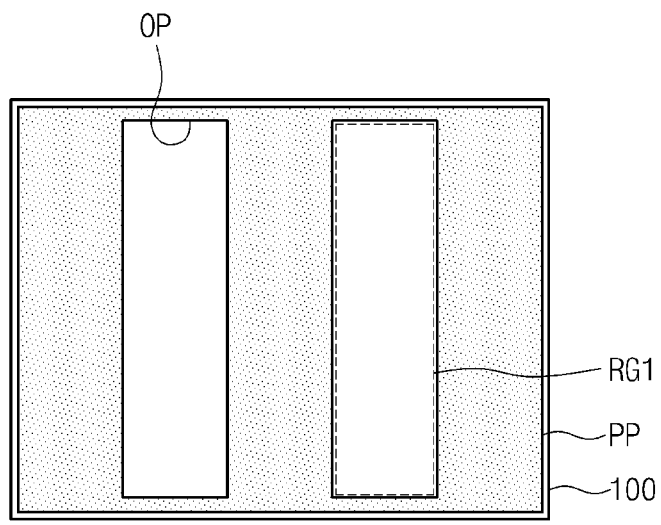
FIGS. 13 and 14 are plan views illustrating a method for forming a hard mask pattern according to embodiments of the inventive concepts.
Figure 14:
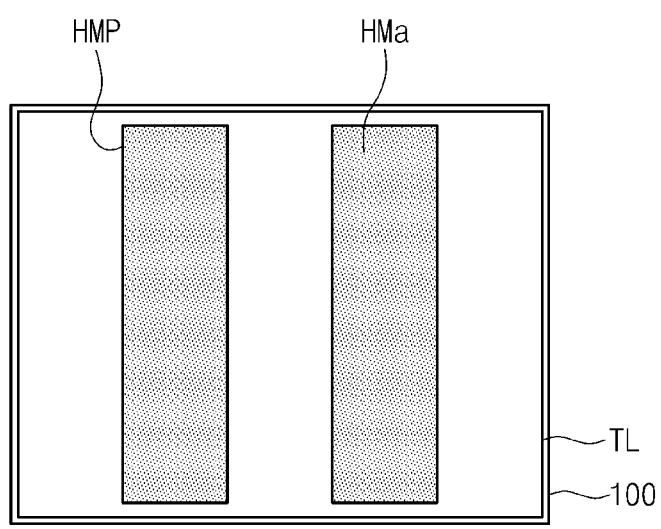

FIGS. 13 and 14 are plan views illustrating a method for forming a hard mask pattern according to embodiments of the inventive concepts. In the present embodiment, the descriptions about the same technical features as in the embodiment of FIGS. 1A to 4A and 1B to 4B will be omitted or only mentioned briefly for the purpose of ease and convenience in explanation.

Referring to FIGS. 13 and 1B, a photoresist pattern PP having openings OP may be formed on the hard mask layer HM. For this embodiment, a planar shape of the opening OP may be a linear shape, such as, but not limited to, a square or a rectangle.

Referring to FIGS. 14 and 3B, specific regions RG of the hard mask layer HM that are exposed through the openings OP may be selectively oxidized to form oxidized portions HMa in the respective specific regions RG. Subsequently, the hard mask layer HM may be patterned using the oxidized portions HMa as etch masks to form hard mask patterns HMP. A planar shape of the hard mask pattern HMP may correspond to the planar shape of the opening OP.

The hard mask patterns formed according to the aforementioned embodiments of the inventive concepts may be used as etch masks in etching processes of various semiconductor devices. Methods for manufacturing a semiconductor device according to embodiments of the inventive concepts will be described hereinafter.

FIGS. 15A to 18A are plan views illustrating a method for manufacturing a magnetic memory device according to embodiments of the inventive concepts. FIGS. 15B to 18B are cross-sectional views taken along lines I-I' of FIGS. 15A to 18A, respectively.

Figure 15A:
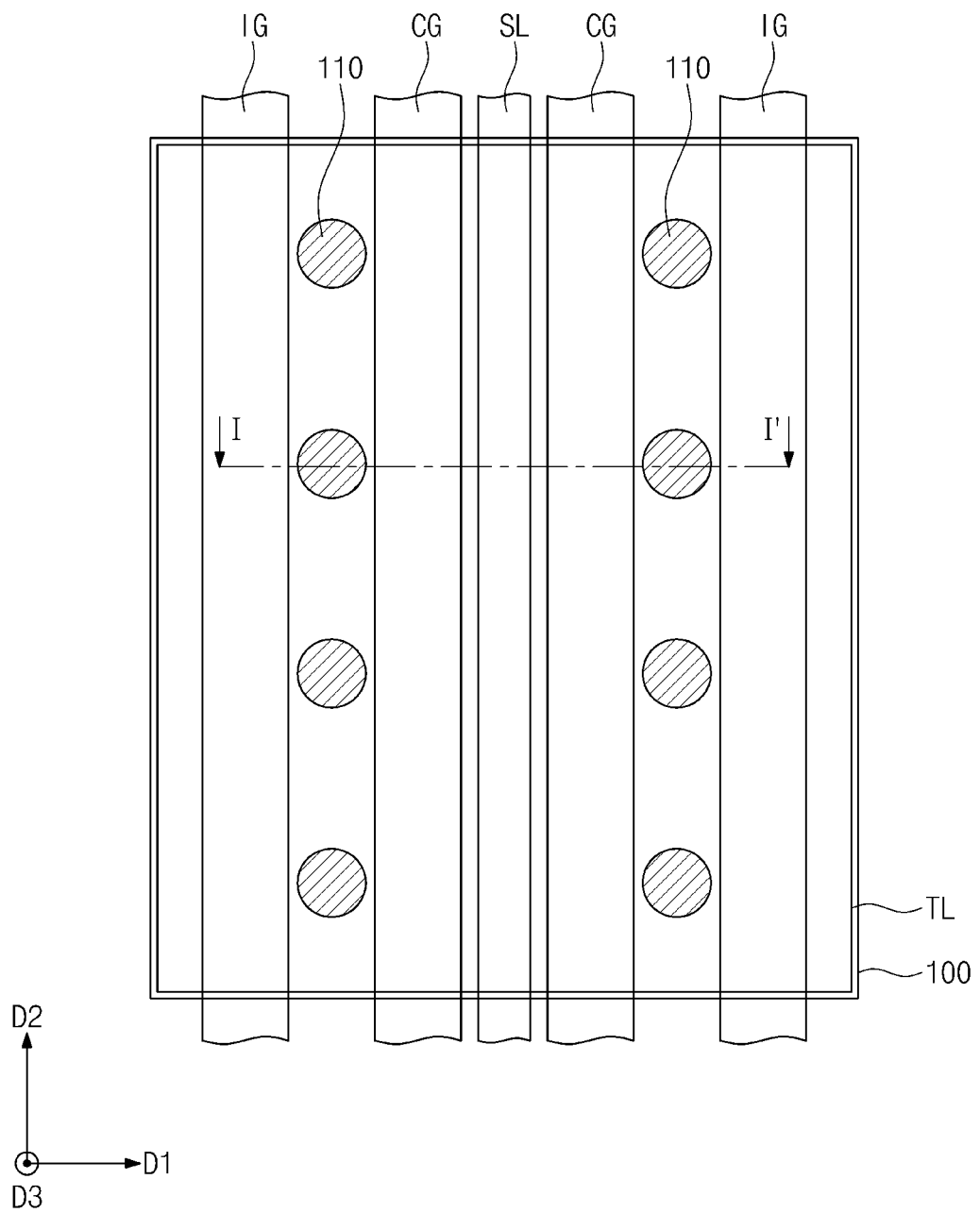
Figure 15B:
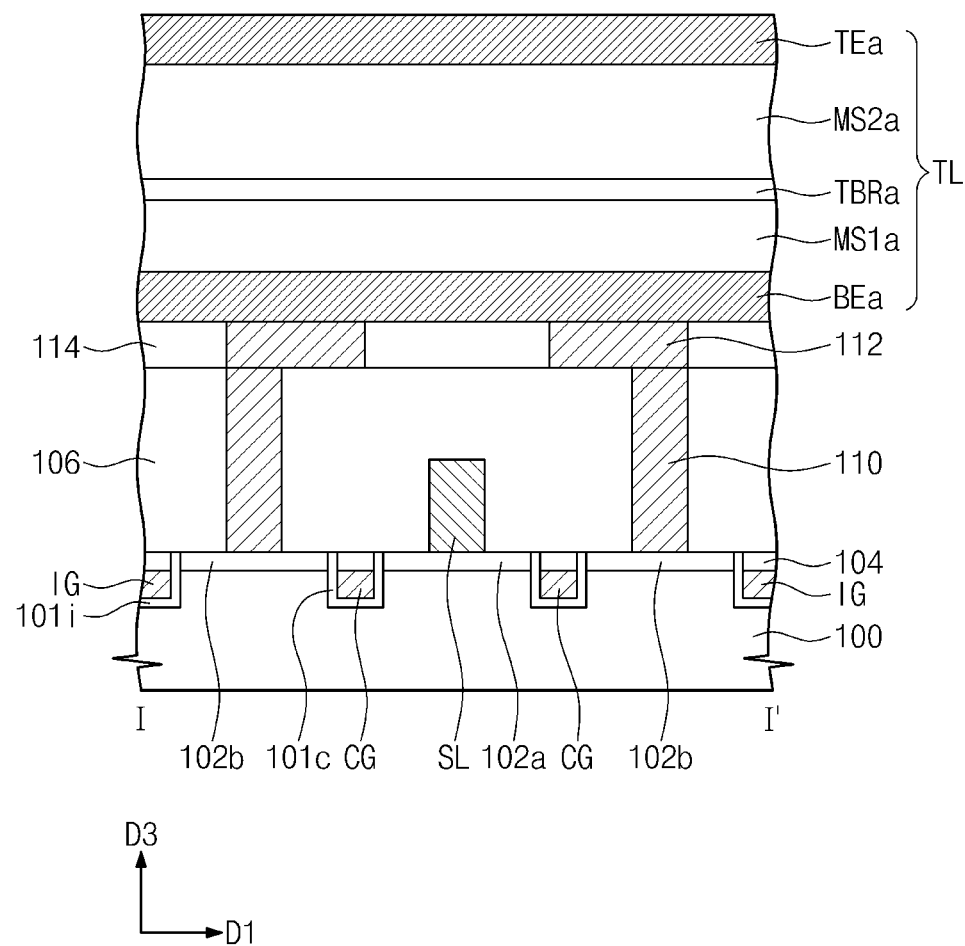

Referring to FIGS. 15A and 15B, selection elements may be formed on a substrate 100. The selection elements may be transistors. The transistors may include cell gate electrodes CG disposed on or in the substrate 100. The cell gate electrodes CG may be spaced apart from each other in a first direction D1 and may extend in a second direction D2 that intersects the first direction D1 substantially perpendicularly. Cell gate dielectric layers 101c may be respectively formed between the substrate 100 and the cell gate electrodes CG.

Isolation gate electrodes IG may be spaced apart from each other with a pair of the cell gate electrodes CG interposed the isolation gate electrodes IG. The isolation gate electrodes IG may be spaced apart from each other in the first direction D1 and may extend in the second direction D2. Isolation gate dielectric layers 101i may be respectively formed between the substrate 100 and the isolation gate electrodes IG.

In some embodiments, forming the cell and isolation gate electrodes CG and IG may include forming gate recess regions. The gate recess regions may be formed in the substrate 100. The gate recess regions may be spaced apart from each other in the first direction D1 and may extend in the second direction D2. Subsequently, the cell and isolation gate dielectric layers 101c and 101i and the cell and isolation gate electrodes CG and IG may be formed in the gate recess regions.

Gate capping patterns 104 may be respectively formed on the cell and isolation gate electrodes CG and IG. The gate capping patterns 104 may be formed to completely fill the gate recess regions on the gate electrodes CG and IG. Top surfaces of the gate capping patterns 104 may be substantially coplanar with a top surface of the substrate 100 by a planarization process.

For example, the cell gate electrodes CG may include at least one of a semiconductor material doped with dopants (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide). The isolation gate electrodes IG may include the same material as the cell gate electrodes CG. For example, the cell gate dielectric layers 101c and the isolation dielectric layers 101i may include at least one of an oxide (e.g., silicon oxide), a nitride (e.g., silicon nitride), an oxynitride (e.g., silicon oxynitride), or a high dielectric material (e.g., an insulating metal oxide such as hafnium oxide or aluminum oxide). The gate capping patterns 104 may include at least one of an oxide (e.g., silicon oxide), a nitride (e.g., silicon nitride), or an oxynitride (e.g., silicon oxynitride).

First and second dopant regions 102a and 102b may be formed at both sides of each of the respective cell gate electrodes CG. The first and second dopants regions 102a and 102b may be doped with dopants having a conductivity type that is different from the conductivity type of the substrate 100.

A source line SL may be formed on the substrate 100 between the pair of cell gate electrodes CG. The source line SL may be electrically connected to the first dopant region 102a between the pair of cell gate electrodes CG. For example, the source line SL may include at least one of a semiconductor material doped with dopants (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide).

A first interlayer insulating layer 106 may be formed on the substrate 100 to cover the cell and isolation gate electrodes CG and IG and the source line SL. Contacts 110 may be formed to penetrate the first interlayer insulating layer 106 and may be connected to the second dopant regions 102b. For example, the first interlayer insulating layer 106 may be formed of a silicon oxide layer and may be formed by a chemical vapor deposition (CVD) process. The contacts 110 may be formed to be connected to the second dopant regions 102b that are not electrically connected with the source line SL. The contacts 110 may include at least one of a metal, a conductive metal nitride, a doped semiconductor material, or a metal-semiconductor compound.

A filling insulation layer 114 may be formed on the first interlayer insulating layer 106, and conductive pads 112 may be formed to penetrate the filling insulation layer 114. The contact pads 112 may be connected to the respective contacts 110. The filling insulation layer 114 may include silicon nitride and may be formed by a CVD process. The conductive pads 112 may include at least one of a metal, a conductive metal nitride, or a doped semiconductor material. Top surfaces of the conductive pads 112 may be substantially coplanar with a top surface of the filling insulation layer 114 by a planarization process.

An etch target layer TL may be formed on the conductive pads 112 and the filling insulation layer 114. Forming the etch target layer TL may include sequentially forming a bottom electrode layer BEa, a first magnetic layer MS1a, a tunnel barrier layer TBRa, a second magnetic layer MS2a, and a top electrode layer TEa. Each of the bottom and top electrode layers BEa and TEa may include at least one of a metal, a conductive metal nitride, or a doped semiconductor material.

Before the formation of the first magnetic layer MS1a, a seed layer (not shown) may be formed on the bottom electrode layer BEa. The first magnetic layer MS1a may be formed using the seed layer as a seed for the lattice structure of the first magnetic layer MS1a. Each of the seed layer, the first magnetic layer MS1a, and the second magnetic layer MS2a may be formed by a PVD process, a CVD process, or an atomic layer deposition (ALD) process.

One of the first magnetic layer MS1a and the second magnetic layer MS2a may be a pinned magnetic layer (or a reference magnetic layer). In an embodiment, the pinned magnetic layer may include cobalt-iron-terbium (CoFeTb) having a terbium (Tb) content of 10% or more, cobalt-iron-gadolinium (CoFeGd) having a gadolinium (Gd) content of 10% or more, cobalt-iron-dysprosium (CoFeDy), FePt having a $L1_0$ structure, FePd having the $L1_0$ structure, CoPd having the $L1_0$ structure, CoPt having the $L1_0$ structure, a CoPt alloy having a hexagonal close packed (HCP) crystal structure, or an alloy including at least one thereof. Alternatively, the pinned magnetic layer may have a stack structure in which magnetic layers and non-magnetic layers are alternately and repeatedly stacked. For example, the stack structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, in which "n" denotes the number of bilayers.

The other of the first magnetic layer MS1a and the second magnetic layer MS2a may be a free magnetic layer. In an embodiment, the free magnetic layer may include a layer including an anti-ferromagnetic material and a layer including a ferromagnetic material. The layer including the anti-ferromagnetic material may include at least one of PtMn, IrMn, MnO, MnS, MnTe, $MnF_2$, $FeCl_2$, FeO, $CoCl_2$, CoO, $NiCl_2$, NiO, or Cr. In an embodiment, the layer including the anti-ferromagnetic material may include at least one precious metals. The precious metal may include ruthenium (Ru), rhodium (Rh), palladium (Pd), osmium (Os), iridium (Ir), platinum (Pt), gold (Au), or silver (Ag). The layer including the ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

A metal may be deposited and the deposited metal may be oxidized to form the tunnel barrier layer TBRa. Alternatively, the tunnel barrier layer TBRa may be deposited by a sputtering process using a metal oxide as a target. The target may include a tunnel barrier material having a stoichiometry that is accurately controlled. The tunnel barrier layer TBRa may include at least one of magnesium oxide (MgO) or aluminum oxide (AlO). For example, the tunnel barrier layer TBRa may be formed of magnesium oxide (MgO) having a sodium chloride crystal structure.

Figure 16A:
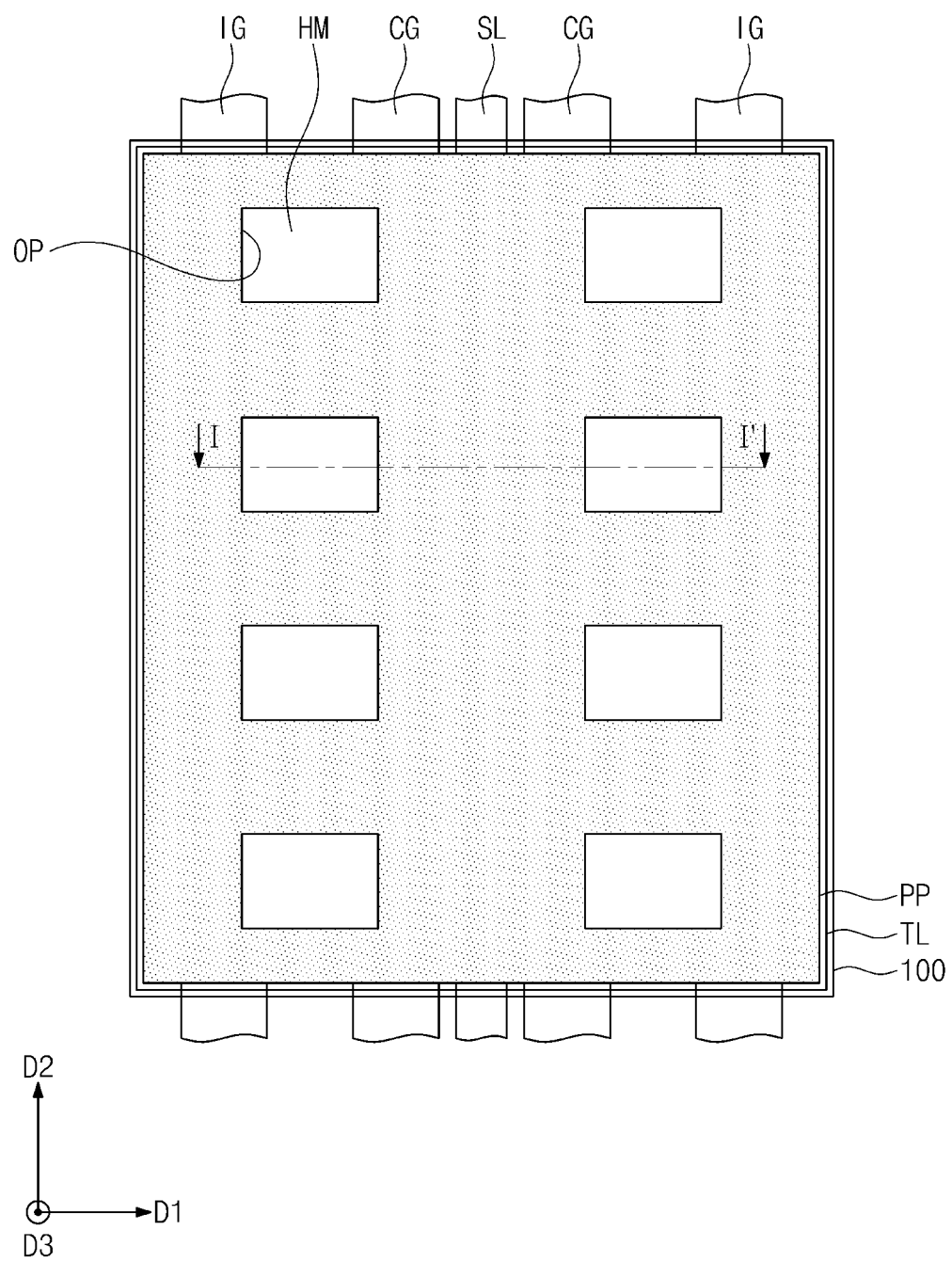
Figure 16B:
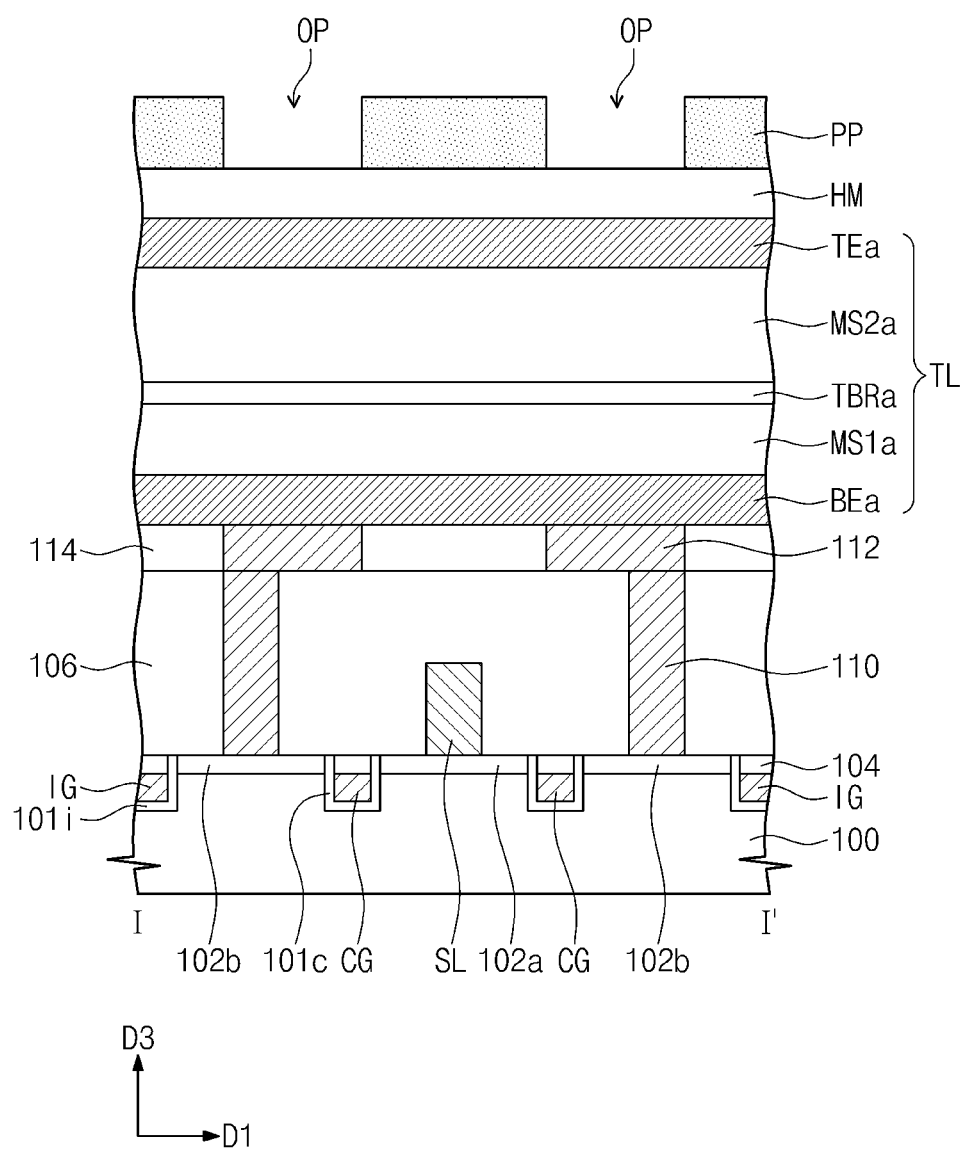

Referring to FIGS. 16A and 16B, a hard mask layer HM may be formed on the top electrode layer TEa. The hard mask layer HM may be formed using a PVD process at a low temperature of about 20° C. to about 275° C. Next, a photoresist pattern PP having openings OP may be formed on the hard mask layer HM. The openings OP may respectively overlap with the conductive pads 112 when viewed in a plan view.

Figure 17A:
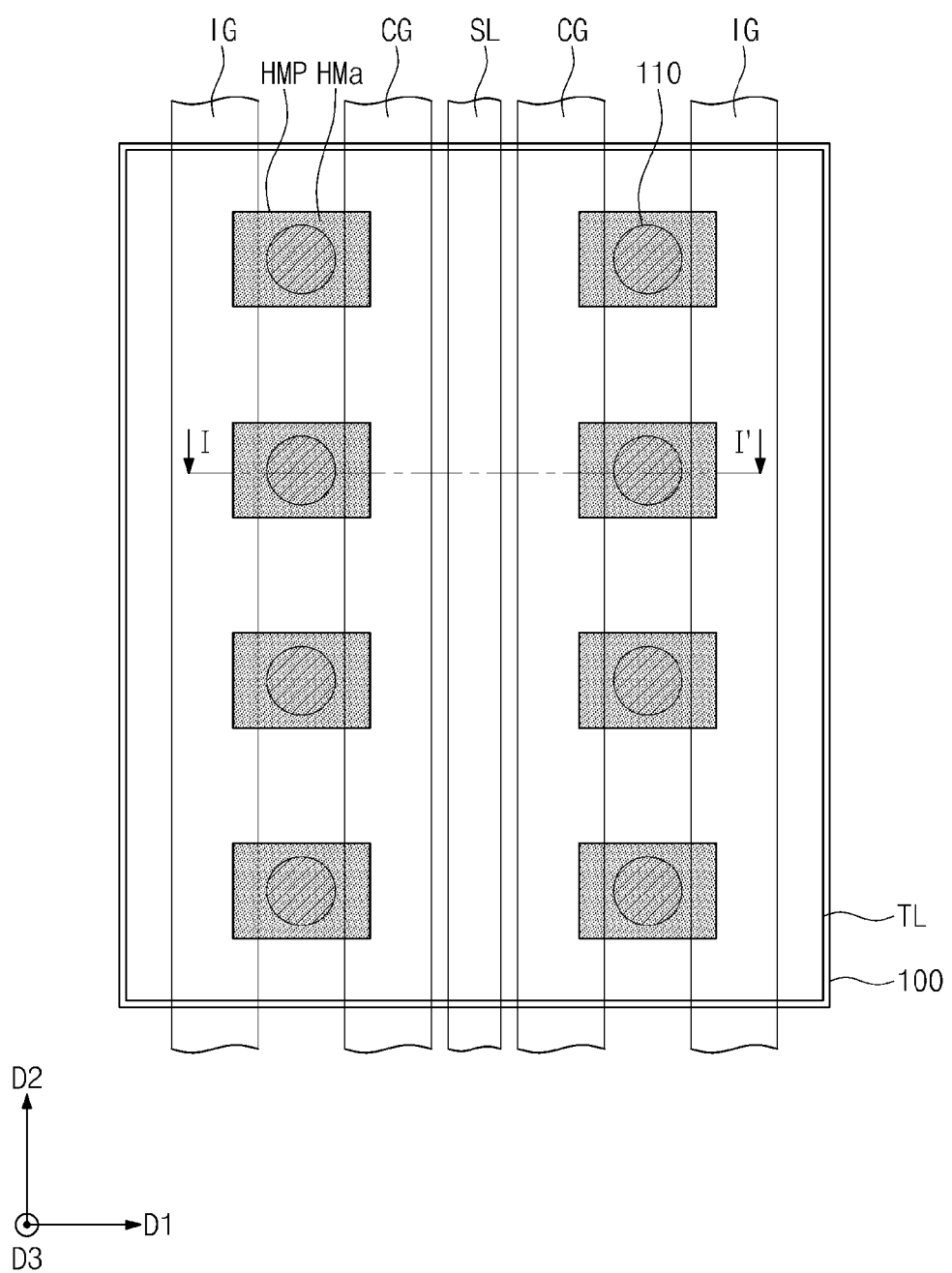
Figure 17B:
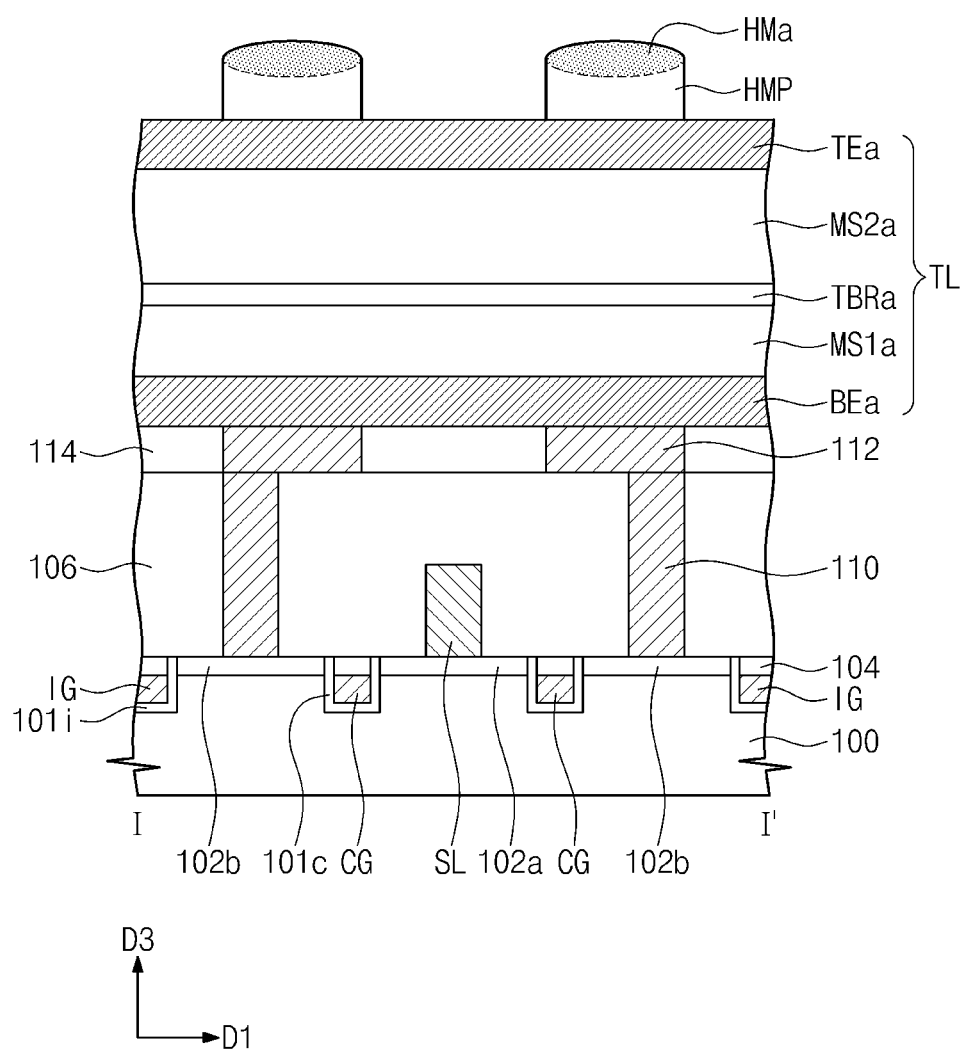

Referring to FIGS. 17A and 17B, specific regions of the hard mask layer HM may be oxidized using the photoresist pattern PP as a mask to form oxidized portions HMa in the respective specific regions of the hard mask layer HM. The oxidized portions HMa may be formed by an oxygen ion implantation process having a process temperature of about 20° C. to about 275° C. Next, the hard mask layer HM may be patterned using the oxidized portions HMa as etch masks to form hard mask patterns HMP. Patterning the hard mask layer HM may be performed using a physical sputtering etching process at a low temperature of about 20° C. to about 275° C.

As described with reference to FIGS. 1A to 4A and 1B and 4B, since the hard mask patterns HMP are formed at a low temperature of about 20° C. to about 275° C., it is possible to prevent characteristic deterioration of the first and second magnetic layers MS1a and MS2a, which are sensitive to high temperatures.

Additionally, the hard mask patterns HMP formed by the method described with reference to FIGS. 1A to 4A and 1B to 4B are described as an example in the present embodiment. However, embodiments of the inventive concepts are not limited thereto. The hard mask patterns HMP may be formed by one of the methods described with reference to FIGS. 5, 6, 7A to 9A, 7B to 9B, 10A to 12A, and 10B to 12B.

Figure 18A:
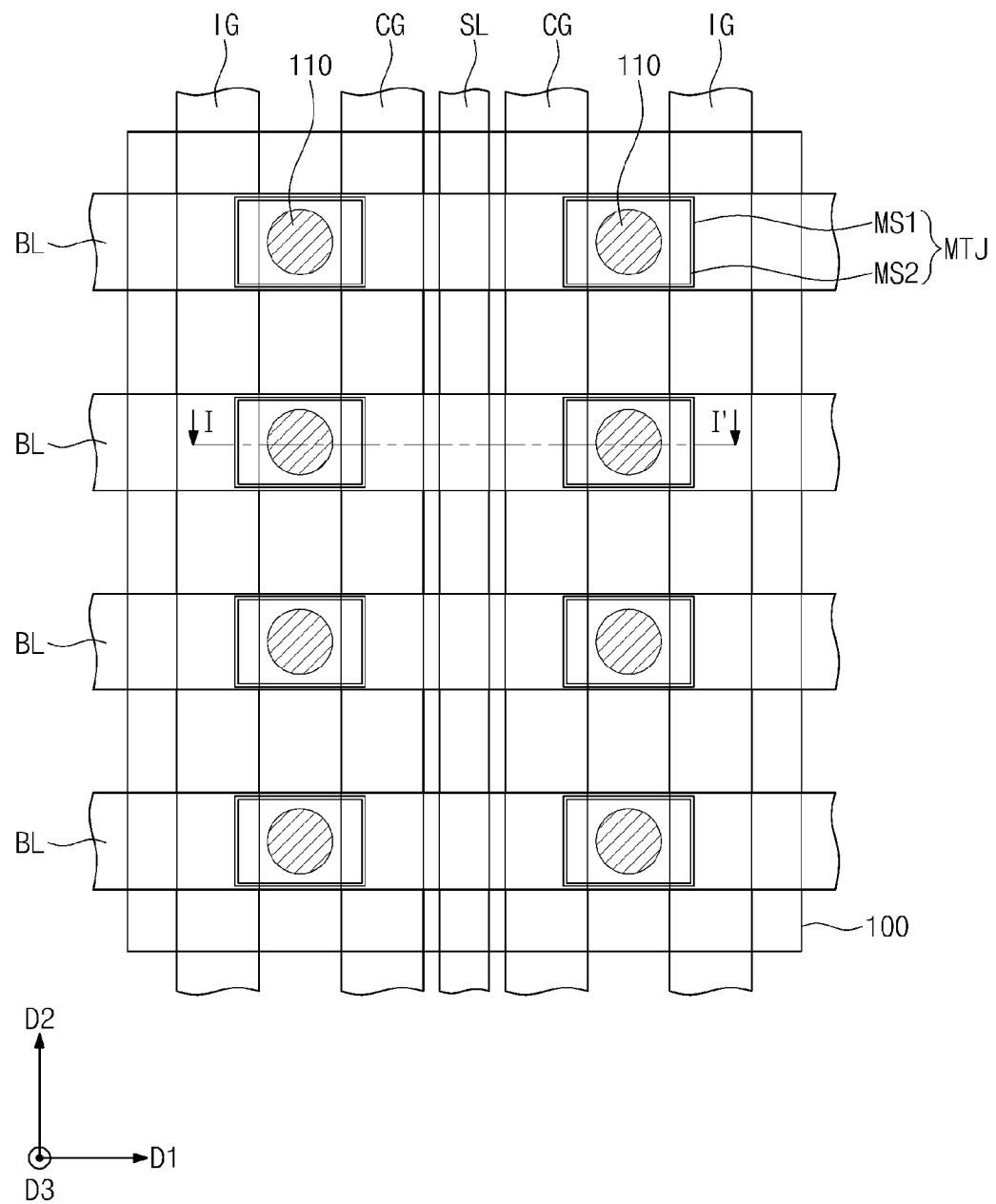
Figure 18B:
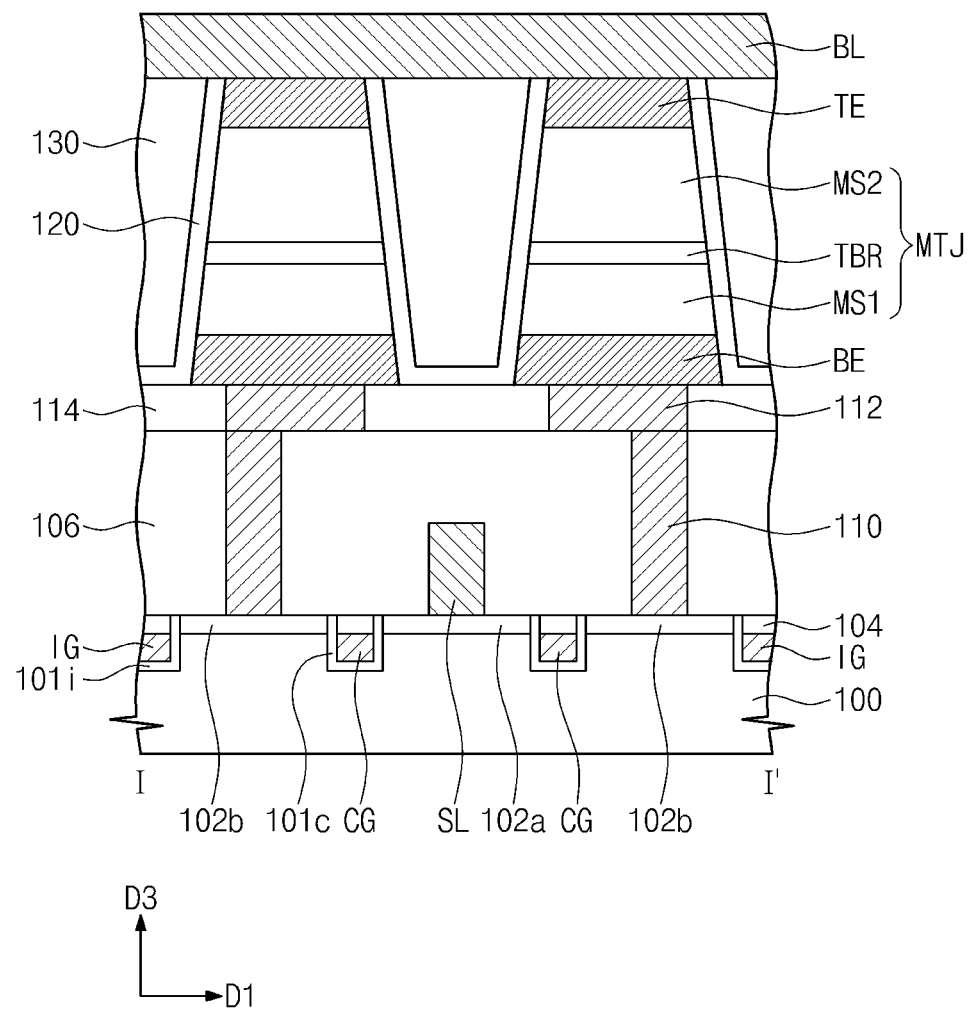

Referring to FIGS. 18A and 18B, the top electrode layer TEa, the second magnetic layer MS2a, the tunnel barrier layer TBRa, the first magnetic layer MS1a, and the bottom electrode layer BEa may be patterned using the hard mask patterns HMP as etch masks to form top electrodes TE, magnetic tunnel junctions MTJ, and bottom electrodes BE. The etch target layer TL may be etched using an ion beam etching process or a dry etching process.

Each of the magnetic tunnel junctions MTJ may include a first magnetic structure MS1 connected to the bottom electrode BE, a second magnetic structure MS2 connected to the top electrode TE, and a tunnel barrier pattern TBR disposed between the first magnetic structure MS1 and the second magnetic structure MS2. The magnetic tunnel junctions MTJ may be spaced apart from each other and may be arranged along the first direction D1 and the second direction D2 when viewed in a plan view. The magnetic tunnel junctions MTJ may vertically overlap with the respective conductive pads 112.

After the formation of the magnetic tunnel junctions MTJ, a capping layer 120 may be formed on the magnetic tunnel junctions MTJ. The capping layer 120 may be formed to cover sidewalls of the magnetic tunnel junctions MTJ, sidewalls of the bottom electrodes BE, and the top surface of the filling insulation layer 114. The capping layer 120 may include a metal oxide layer and may be formed by a CVD process.

A second interlayer insulating layer 130 may be formed on the capping layer 120. In an embodiment, as illustrated in FIG. 18B, the capping layer 120 and the second interlayer insulating layer 130 may be sequentially formed and may be then planarized until top surfaces of the top electrodes are exposed. The second interlayer insulating layer 130 may include, for example, a silicon oxide layer. Bit lines BL may be formed on the second interlayer insulating layer 130. The bit lines BL may be spaced apart from each other in the second direction D2 and may extend in the first direction D1 that is substantially perpendicular to the second direction D2 when viewed in a plan view. Each of the bit lines BL may be connected to the top electrodes TE arranged along the first direction D1. For example, the bit lines BL may include at least one of a metal or a conductive metal nitride.

FIGS. 19A to 23A are plan views illustrating a method for manufacturing a semiconductor device according to embodiments of the inventive concepts. FIGS. 19B to 23B are cross-sectional views taken along lines I-I' of FIGS. 19A to 23A, respectively.

Figure 19A:
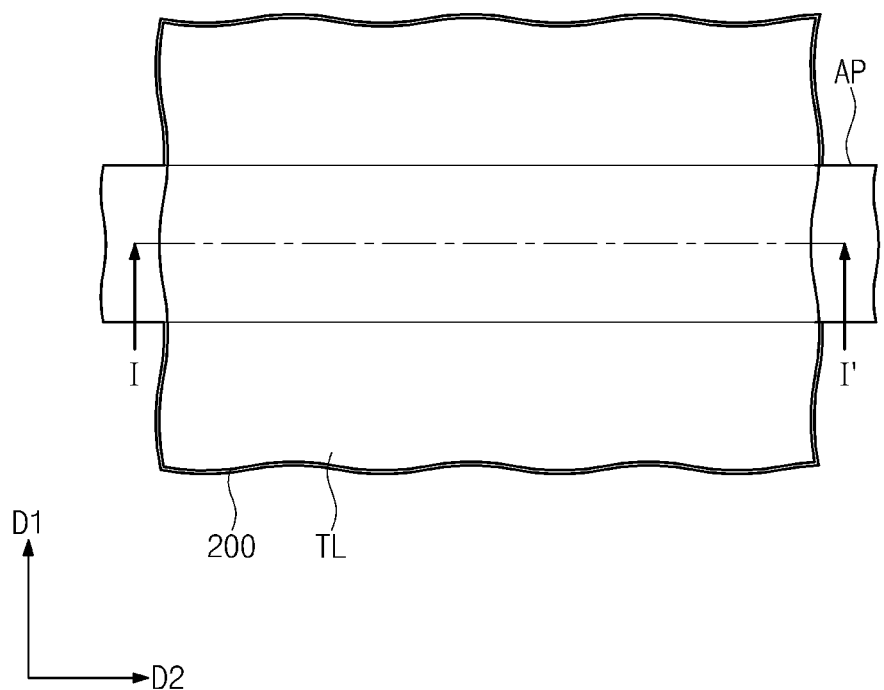
Figure 19B:
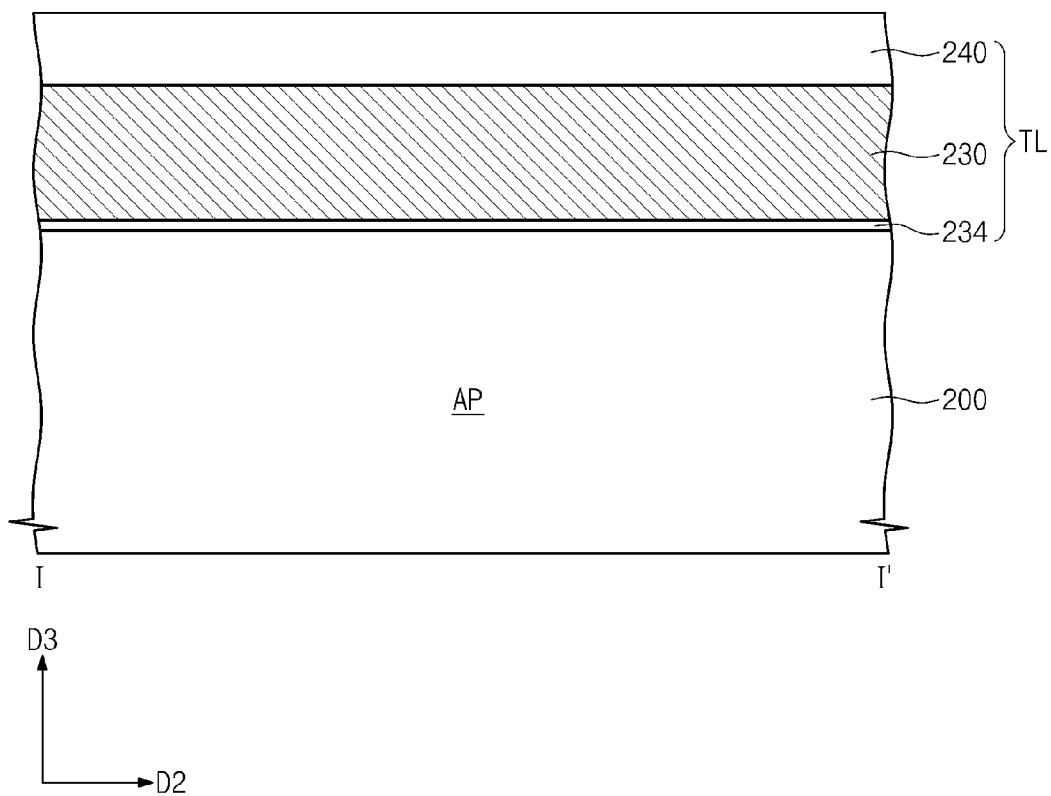

Referring to FIGS. 19A and 19B, a device isolation pattern (see 204 of FIG. 22A) may be formed in a substrate 200 to define an active pattern AP. The substrate 200 may be a semiconductor substrate including silicon, germanium, or silicon-germanium or may be a compound semiconductor substrate. The device isolation pattern 204 may be formed by a shallow-trench isolation method. For example, a trench may be formed in the substrate 200, and the device isolation pattern 204 may be formed in the trench. The device isolation pattern 204 may include an insulating material (e.g., silicon oxide).

The active pattern AP may correspond to a portion of the substrate 200, which is surrounded by the device isolation pattern 204. The active pattern AP may have a linear shape or bar shape extending in a second direction D2 parallel to a top surface of the substrate 200. One active pattern AP is illustrated as an example in FIG. 19A. Alternatively, a plurality of active patterns AP may be provided. The plurality of active patterns AP may be arranged along a first direction D1 that intersects the second direction D2 substantially perpendicularly. The active patterns AP may be doped with dopants of a first conductivity type.

An etch target layer TL may be formed on the substrate 200. The etch target layer TL may include a dielectric layer 234 and a conductive layer 230 that are sequentially formed on the substrate 200. A capping layer 240 may be formed on the etch target layer TL. The capping layer 240 may be a buffer layer that protects the etch target layer TL during a process of forming hard mask patterns HMP.

The dielectric layer 234 may include a low-k dielectric material or a high-k dielectric material. The low-k dielectric material may, for example, include silicon oxide. The high-k dielectric material may, for example, include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

The conductive layer 230 may include at least one of poly-silicon, a metal nitride (e.g., titanium nitride or tantalum nitride), or a metal material (e.g., titanium, tantalum, tungsten, copper, or aluminum). The poly-silicon may be doped with dopants.

For example, the capping layer 240 may include at least one of silicon nitride or silicon oxynitride. In an alternative embodiment, the capping layer 240 may be omitted.

Figure 20A:
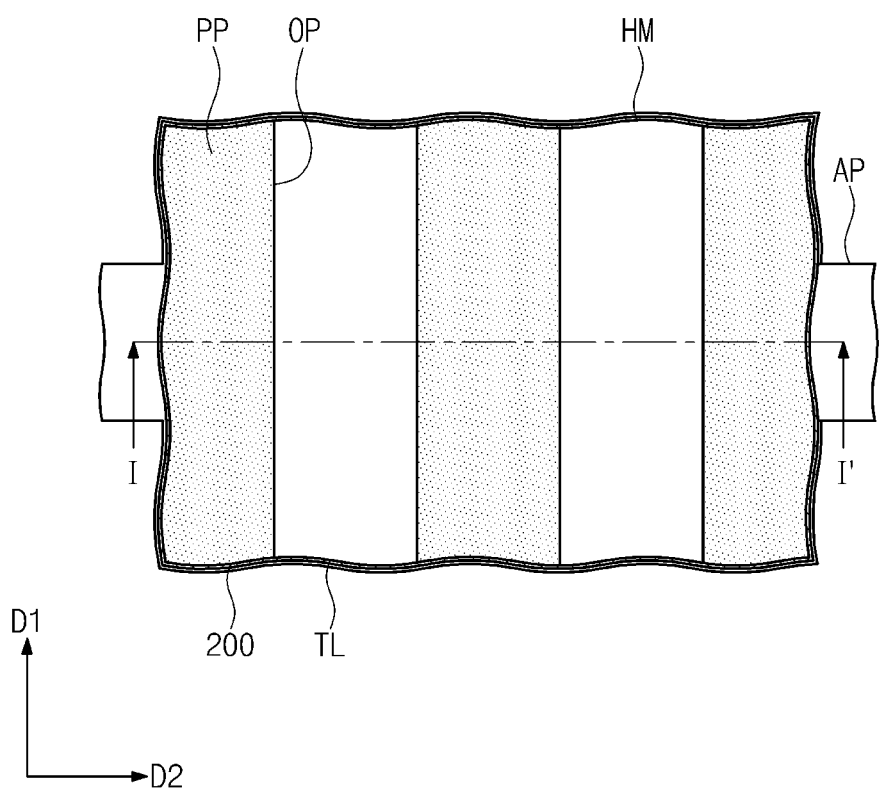
Figure 20B:
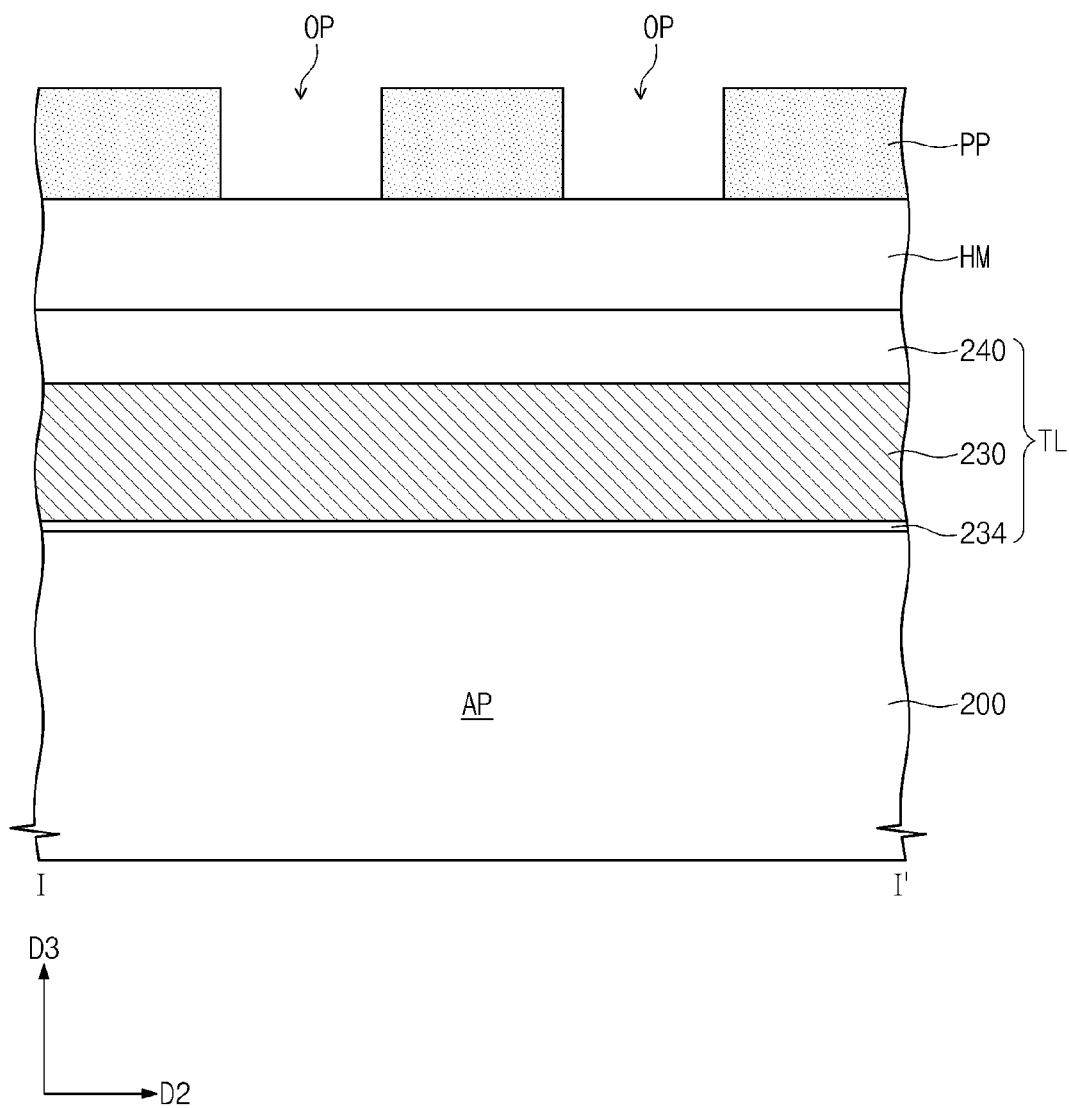

Referring to FIGS. 20A and 20B, a hard mask layer HM may be formed on the capping layer 240. The hard mask layer HM may be formed using a PVD process at a low temperature between about 20° C. and about 275° C. Next, a photoresist pattern PP having openings OP may be formed on the hard mask layer HM. Each of the openings OP may intersect the active pattern AP and may have a linear shape or a bar shape extending in the first direction D1.

Figure 21A:
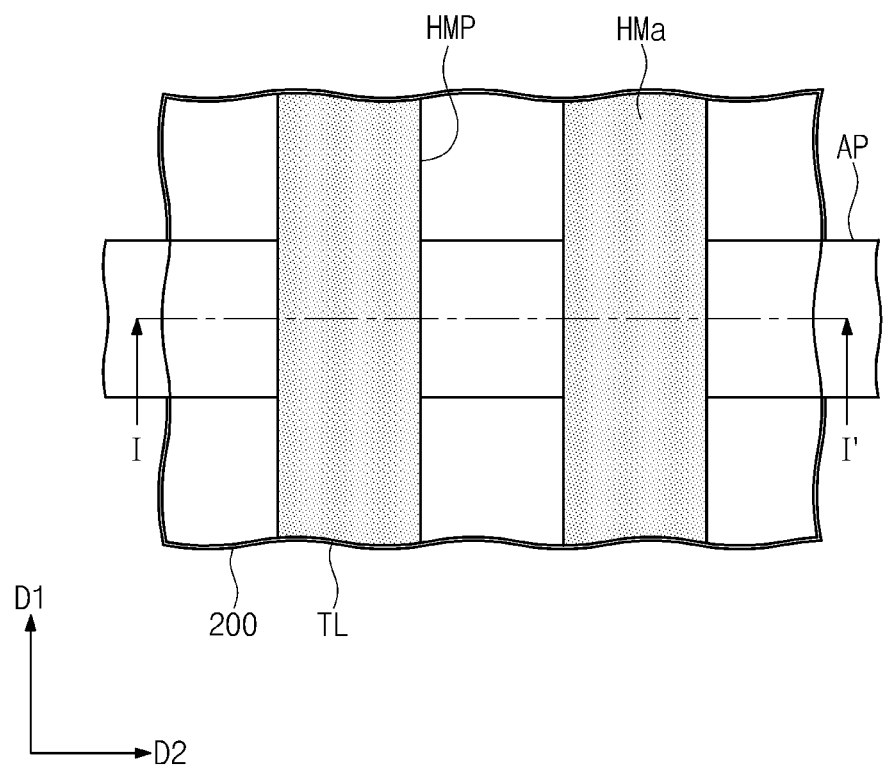
Figure 21B:
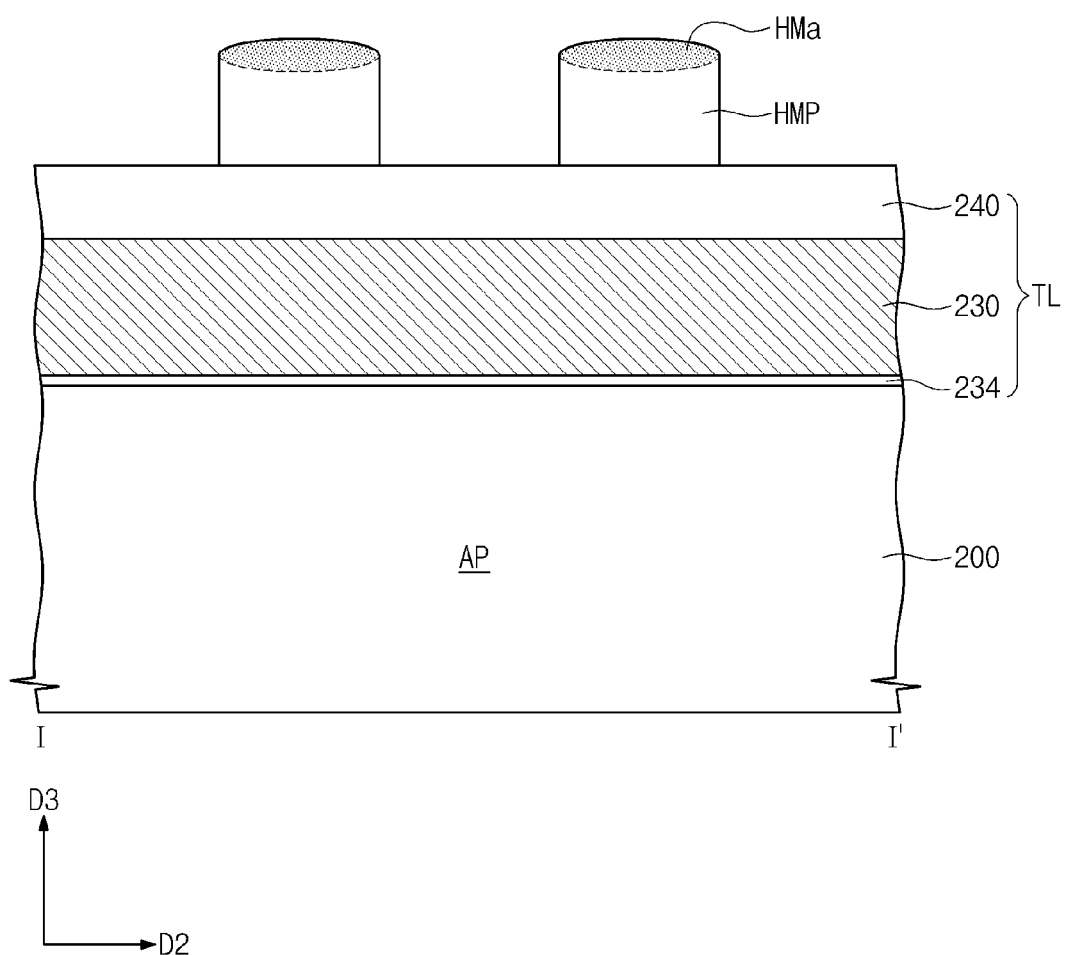

Referring to FIGS. 21A and 21B, specific regions of the hard mask layer HM may be oxidized using the photoresist pattern PP as a mask to form oxidized portions HMa in the respective specific regions of the hard mask layer HM. The oxidized portions HMa may be formed by an oxygen ion implantation process having a process temperature between about 20° C. and about 275° C. The capping layer 240 may prevent oxidation of the conductive layer 230 during the oxidation process of the hard mask layer HM. Subsequently, the hard mask layer HM may be patterned using the oxidized portions HMa as etch masks to form hard mask patterns HMP. Patterning the hard mask layer HM may be performed using a physical sputtering etching process at a low temperature of about 20° C. to about 275° C. The capping layer 240 may prevent etch damage of the conductive layer 230 during the etching process.

As described with reference to FIGS. 1A to 4A and 1B and 4B, since the hard mask patterns HMP are formed at a low temperature between about 20° C. and about 275° C., it is possible to prevent characteristic deterioration or damage of the conductive layer 230 that may include a metal material having a low melting point.

Additionally, the hard mask patterns HMP formed by the method described with reference to FIGS. 1A to 4A and 1B to 4B are described as an example in the present embodiment. However, embodiments of the inventive concepts are not limited thereto. The hard mask patterns HMP may be formed by one of the methods described with reference to FIGS. 5, 6, 7A to 9A, 7B to 9B, 10A to 12A, and 10B to 12B.

Figure 22A:
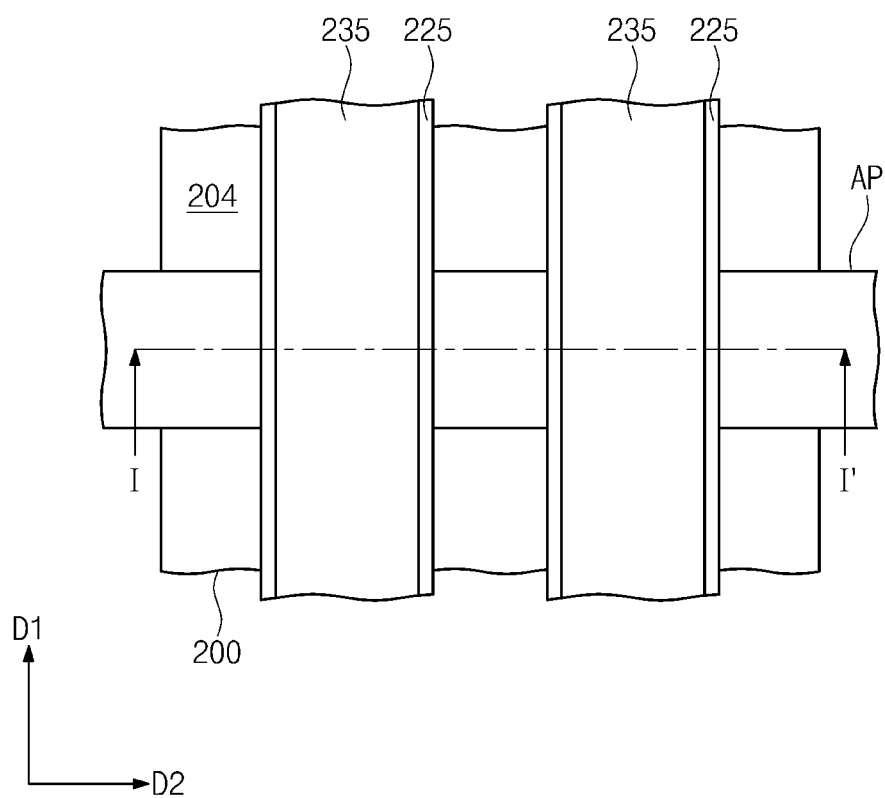
Figure 22B:
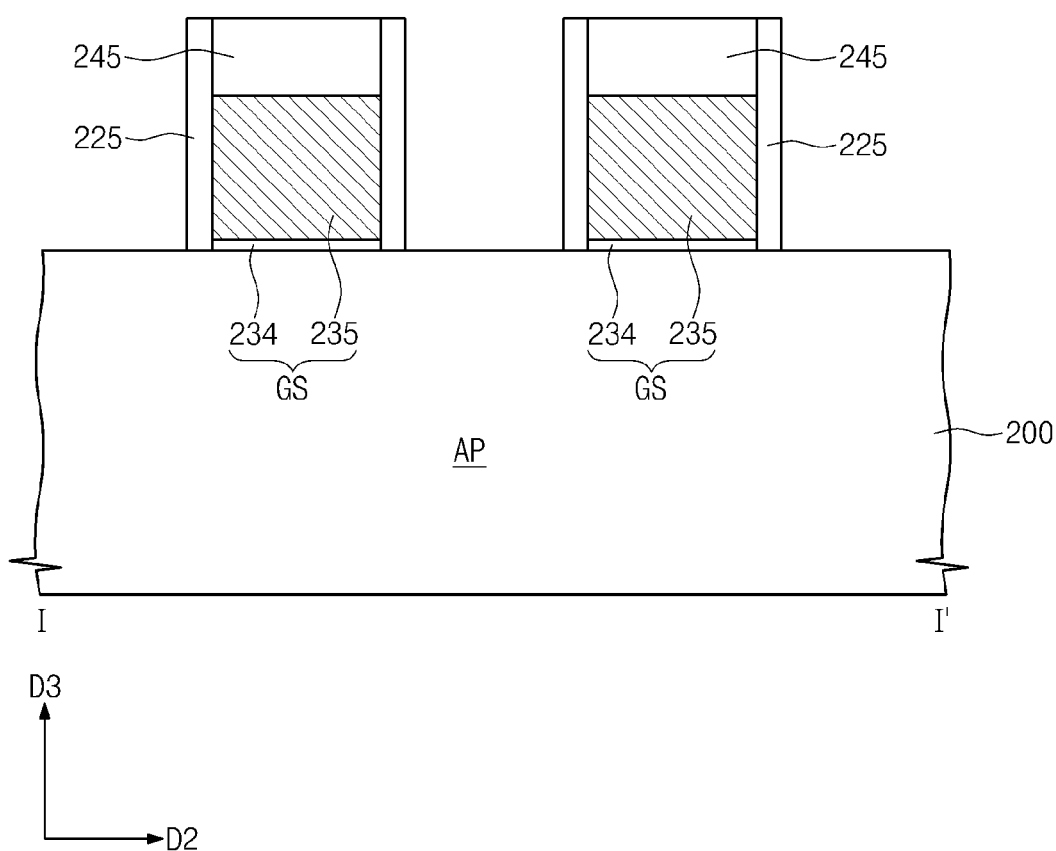

Referring to FIGS. 22A and 22B, the capping layer 240, the conductive layer 230, and the dielectric layer 234 may be patterned using the hard mask patterns HMP as etch masks to form capping patterns 245 and gate structures GS. The capping patterns 245 may cover top surfaces of the respective gate structures GS. Each of the gate structures GS may include a gate electrode 235 and a dielectric layer 234. A pair of gate spacers 225 may be respectively formed on both sidewalls of the gate structure GS and both sidewalls of the capping pattern 245.

Figure 23A:
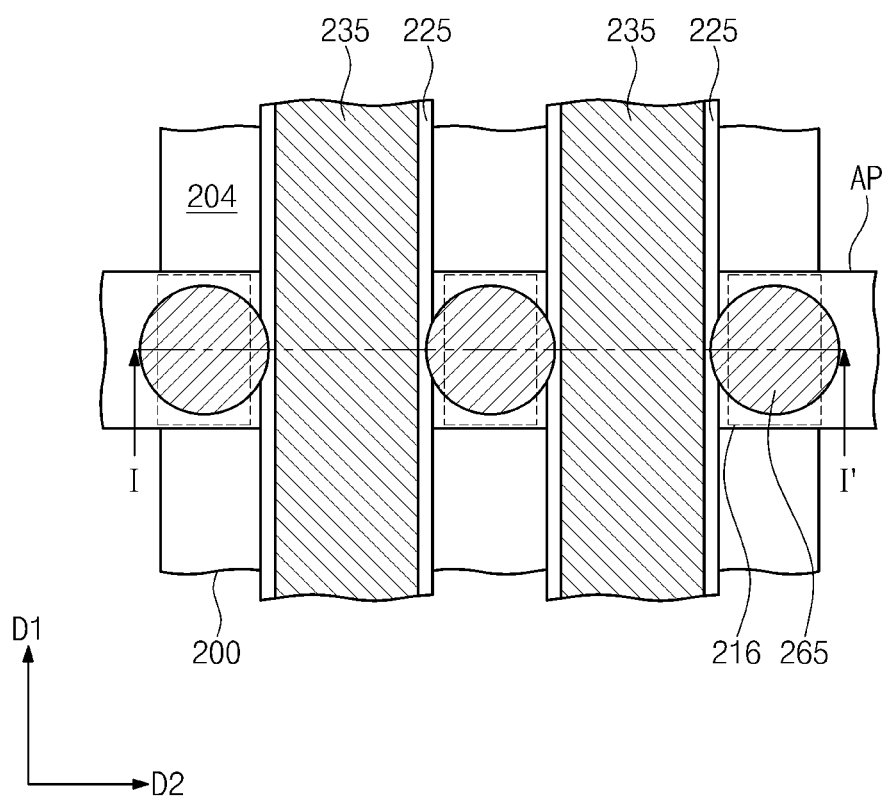
Figure 23B:
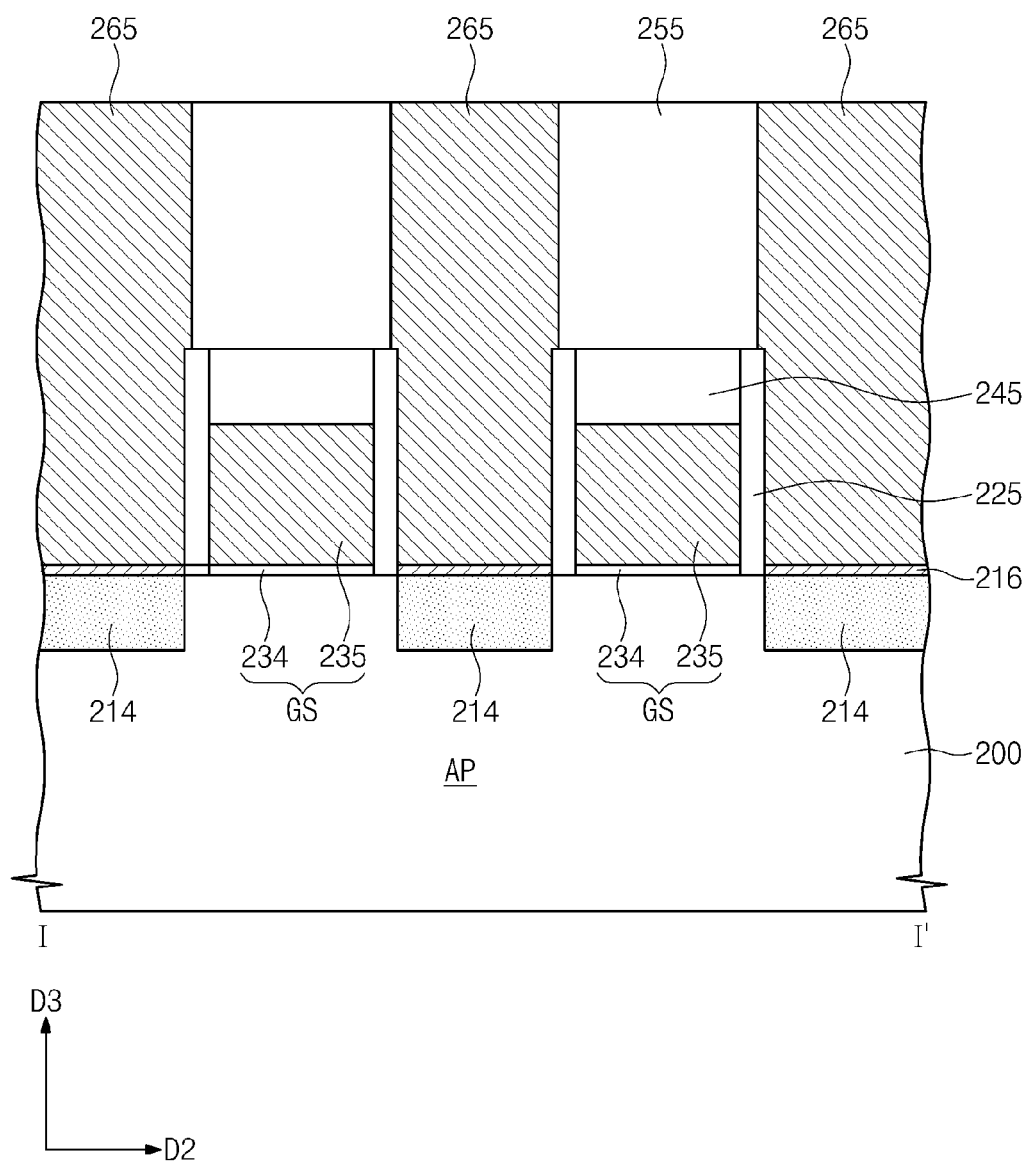

Referring to FIGS. 23A and 23B, source/drain regions 214 may be formed in the active pattern AP at both sides of the gate structure GS. In an embodiment, the source/drain regions 214 may be formed by injecting dopants into the active pattern AP using the capping patterns 245 and the gate spacers 225 as masks. In an embodiment, the active pattern AP may be etched using the capping patterns 245 and the gate spacers 225 as etch masks to form recess regions, and epitaxial patterns may be grown in the recess regions. Dopants may be provided into the epitaxial patterns, thereby forming the source/drain regions 214. In addition, silicide layers 216 may be respectively formed on the source/drain regions 214.

Next, a first interlayer insulating layer (see, for example, 106 in FIG. 15B) may be formed on an entire surface of the substrate 200 to cover the source/drain regions 214. The first interlayer insulating layer may be planarized until top surfaces of the capping patterns 245 are exposed. A second interlayer insulating layer 255 may be formed on the first interlayer insulating layer. Contacts 265 may be formed to penetrate the second interlayer insulating layer 255 and the first interlayer insulating layer. The contacts 265 may be connected to the silicide layers 216.

Figure 24:
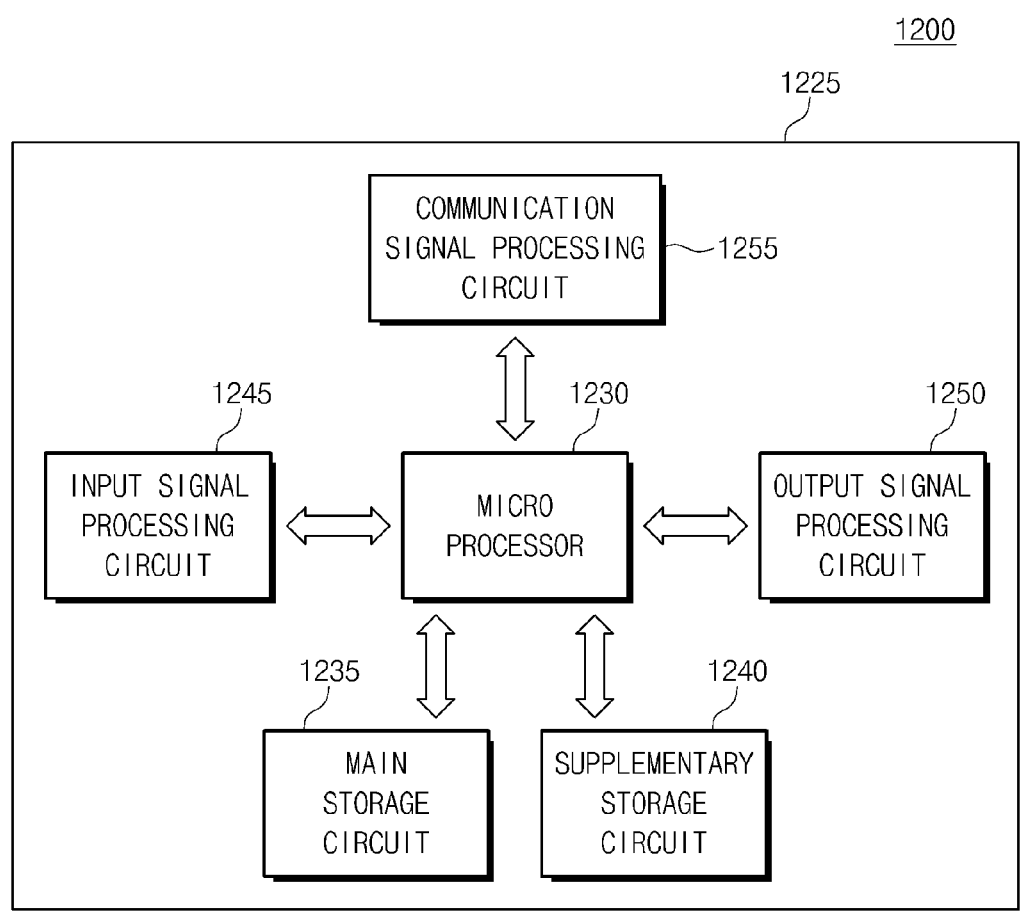
FIG. 24 is a block diagram schematically illustrating an electronic circuit board including a semiconductor package according to an example embodiment.

FIG. 24 is a block diagram schematically illustrating an electronic circuit board 1200 including a semiconductor device formed using a hard mask according to an example embodiment.

In detail, the electronic circuit board 1200 may include a microprocessor 1230 disposed on a circuit board 1225, a main storage circuit 1235 and a supplementary storage circuit 1240 that communicate with the microprocessor 1230, an input signal processing circuit 1245 that transfers a command to the microprocessor 1230, an output signal processing circuit 1250 that receives a command from the microprocessor 1230, and a communication signal processing unit 1255 that exchanges an electrical signal with other circuit boards. It may be understood that each of arrows refers to a path through which an electrical signal is transferred.

The microprocessor 1230 may receive and process various electrical signals to output a result of the processing and may control the other elements of the electronic circuit board 1200. It may be understood that the microprocessor 1230 is, for example, a central processing unit (CPU) and a main control unit (MCU).

The main storage circuit 1235 may temporarily store data, which is always or frequently required by the microprocessor 1230, before-processing data, and after-processing data. The main storage circuit 1235 may need a fast response, and thus may be configured with a semiconductor memory chip. In detail, the main storage circuit 1235 may be a semiconductor memory called a cache. The main storage circuit 1235 may be configured with static random access memory (SRAM), dynamic random access memory (DRAM), resistive random access memory (RRAM), and application semiconductor memories thereof (for example, a utilized RAM, a ferro-electric RAM, a fast cycle RAM, a phase changeable RAM, a magnetic RAM, and/or the like) or may be configured with other semiconductor memories.

Additionally, the main storage circuit 1235 may include a random access memory (RAM) irrespective of volatility/non-volatility. In the present embodiment, the main storage circuit 1235 may include one or more semiconductor chips, semiconductor packages, or semiconductor modules according to the exemplary embodiments. The supplementary storage circuit 1240 may be a large-capacity storage element and may be configured with a nonvolatile semiconductor memory, such as flash memory or the like, or a hard disk drive using a magnetic field. Alternatively, the supplementary storage circuit 1240 may be configured with a compact disk drive using light. Although the supplementary storage circuit 1240 does not desire a fast speed in comparison with the main storage circuit 1235, the supplementary storage circuit 1240 may be applied to a case of desiring to store large-scale data. The supplementary storage circuit 1240 may include a nonvolatile storage element irrespective of random/nonrandom.

The supplementary storage circuit 1240 may include a semiconductor device formed using a hard mask according to an example embodiment disclosed herein. The input signal processing circuit 1245 may convert an external command into an electrical signal or may transfer an electrical signal, transferred from the outside, to the microprocessor 1230.

A command or an electrical signal transferred from the outside may be an operation command, an electrical signal that is to be processed, or data that are to be stored. The input signal processing circuit 1245 may be a terminal signal processing circuit that processes a signal transmitted from a keyboard, a mouse, a touch pad, an image recognition device, or various sensors, an image signal processing circuit that processes an image signal transferred from a scanner or a camera, various sensors, an input signal interface, or the like. The input signal processing circuit 1245 may include a semiconductor device formed using a hard mask according to an example embodiment disclosed herein.

The output signal processing circuit 1250 may be an element for transmitting an electrical signal, generated through processing by the microprocessor 1230, to the outside. For example, the output signal processing circuit 1250 may be a graphic card, an image processor, an optical converter, a beam panel card, one of various functional interface circuits, or the like. The output signal processing circuit 1250 may include a semiconductor device formed using a hard mask according to an example embodiment disclosed herein.

The communication circuit 1255 may be an element for directly exchanging an electrical signal with other electronic systems or other circuit boards without undergoing the input signal processing circuit 1245 or the output signal processing circuit 1250. For example, the communication circuit 1255 may include a modem, a LAN card, various interfaces, and/or the like of a personal computer (PC) system. The communication circuit 1255 may include the semiconductor package according to the example embodiments disclosed herein.

Figure 25:
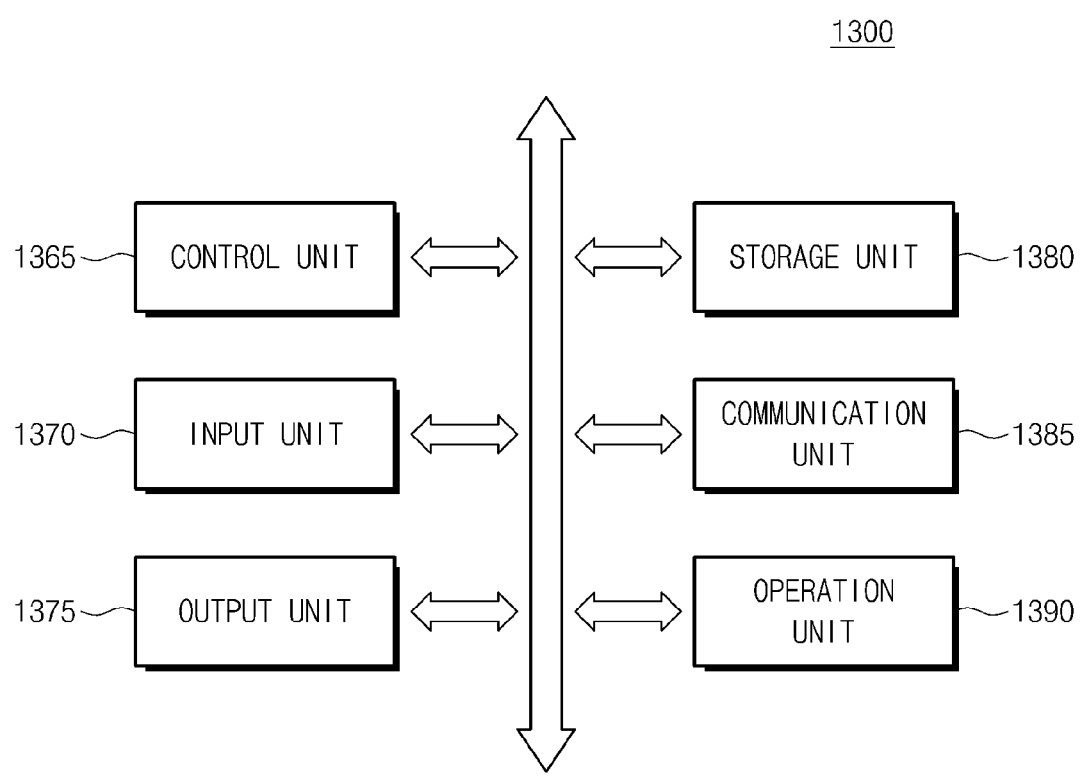
FIG. 25 is a block diagram schematically illustrating an electronic system according to an example embodiment disclosed herein.

FIG. 25 is a block diagram schematically illustrating an electronic system 1300 that includes a semiconductor device formed using a hard mask according to an example embodiment disclosed herein.

In detail, the electronic system 1300 according to an exemplary embodiment may include a control unit 1365, an input unit 1370, an output unit 1375, and a storage unit 1380. Also, the electronic system 1300 may further include a communication unit 1385 and/or an operation unit 1390.

The control unit 1365 may overall control the electronic system 1300 and elements. The control unit 1365 may be understood as a CPU or a central control unit, and may include the electronic circuit board 1200 (see FIG. 22) according to an exemplary embodiment disclosed herein. Also, the control unit 1365 may include a semiconductor device formed using a hard mask according to an example embodiment disclosed herein.

The input unit 1370 may transfer an electrical command signal to the control unit 1365. The input unit 1370 may be a keyboard, a keypad, a touch pad, an image recognizer such as a scanner, or various input sensors. The input unit 1370 may include a semiconductor device formed using a hard mask according to an example embodiment disclosed herein.

The output unit 1375 may receive the electrical command signal from the control unit 1365 to output a result of processing by the electronic system 1300. The output unit 1375 may be a monitor, a printer, a beam irradiator, or one of various mechanical devices. The output unit 1375 may include a semiconductor device formed using a hard mask according to an example embodiment disclosed herein.

The storage unit 1380 may be an element for temporarily or permanently storing an electrical signal, which is to be processed by the control unit 1165, and an electrical signal generated through processing by the control unit 1165. The storage unit 1380 may be physically or electrically connected or coupled to the control unit 1365. The storage unit 1380 may be a semiconductor memory, a magnetic storage device such as a hard disk or the like, an optical storage device such as a compact disk or the like, a server having a data storing function, or the like. Also, the storage unit 1380 may include a semiconductor device formed using a hard mask according to an example embodiment disclosed herein.

The communication unit 1385 may receive an electrical command signal from the control unit 1365 and may transfer the electrical command signal to another electronic system, or may receive an electrical command signal from the other electronic system. The communication unit 1385 may be a modem, a wired transmission/reception device such as an LAN card, a wireless transmission/reception device such as a Wibro interface, an infrared port, or the like. Also, the communication unit 1385 may include a semiconductor device formed using a hard mask according to an example embodiment disclosed herein.

The operation unit 1390 may perform a physical or mechanical operation according to a command of the control unit 1365. For example, the operation unit 1390 may be an element, which performs a mechanical operation, such as a plotter, an indicator, an up/down operation, or the like. The electronic system 1300 according to an exemplary embodiment may include a computer, a network server, a networking printer, or a scanner, a wireless controller, a mobile communication terminal, an exchanger, an electronic device performs a programmed operation, and/or the like.

Moreover, the electronic system 1300 may be applied to mobile phones, MP3 players, navigation devices, portable multimedia players (PMPs), solid state disks (SSDs), household appliances, etc.

The method for forming the hard mask pattern according to embodiments of the inventive concepts may be easily and conveniently performed at a low temperature. Thus, even though the etch target layer under the hard mask pattern includes a material (e.g., the metal or the magnetic material) that is sensitive to a high temperature, characteristic variations of the etch target layer may be minimized when the etch target layer is patterned according to the subject matter disclosed herein.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A method for forming a hard mask pattern, the method comprising:
    forming a hard mask layer on an etch target layer that is disposed on a substrate;
    forming a first photoresist pattern having an opening on the hard mask layer, the opening exposing one region of the hard mask layer;
    performing an oxygen ion implantation process on the one region of the hard mask layer using the first photoresist pattern as a mask to form an oxidized portion in the one region of the hard mask layer; and
    patterning the hard mask layer using the oxidized portion as an etch mask.

2. The method of claim 1, wherein the hard mask layer includes at least one of aluminum (Al) or magnesium (Mg).

3. The method of claim 1, wherein the hard mask layer includes a metal, and
    wherein the forming of the hard mask layer comprises:
        performing a physical vapor deposition (PVD) process at a temperature between about 20° C. and about 275° C.

4. The method of claim 1, further comprising:
    forming a buffer layer between the etch target layer and the hard mask layer.

5. The method of claim 1, wherein a bottom surface of the oxidized portion is substantially coplanar with a bottom surface of the hard mask layer.

6. The method of claim 1, wherein the oxygen ion implantation process is performed at a temperature between about 20° C. and about 275° C.

7. The method of claim 1, wherein an implantation dose of the oxygen ion implantation process ranges from about $1.0 \times 10^{14}/cm^2$ to about $1.0 \times 10^{16}/cm^2$.

8. The method of claim 1, wherein the patterning of the hard mask layer comprises:
    performing a physical sputtering etching process at a temperature between about 20° C. and about 275° C.

9. The method of claim 1, further comprising:
    forming a spacer on an inner sidewall of the opening,
    wherein the performing of the oxygen ion implantation process comprises: performing the oxygen ion implantation process on the one region using the first photoresist pattern and the spacer as masks to form the oxidized portion in the one region.

10. The method of claim 1, further comprising:
    forming a second photoresist pattern having an opening on the hard mask layer, the opening exposing another region of the hard mask layer;
    performing an oxygen ion implantation process on the another region using the second photoresist pattern as a mask to form an oxidized portion in the another region; and
    patterning the hard mask layer using the oxidized portions as etch masks.

11. A method for manufacturing a semiconductor device, the method comprising:

forming an etch target layer including at least one of a metal or a magnetic material on a substrate;
forming a hard mask pattern on the etch target layer in a temperature range between about 20° C. and about 275° C.; and
etching the etch target layer using the hard mask pattern as an etch mask to form a target pattern,
wherein the forming of the hard mask pattern comprises:
forming a hard mask layer on the etch target layer;
forming a photoresist pattern on the hard mask layer;
forming an oxidized portion in an upper portion of a region of the hard mask layer by using the photoresist pattern as a mask; and
patterning the hard mask layer using the oxidized portion as an etch mask.

12. The method of claim 11, wherein the forming of the etch target layer comprises:
forming a free magnetic layer, a pinned magnetic layer, and a tunnel barrier layer disposed between the free and pinned magnetic layers, and
wherein the etching of the etch target layer comprises: etching the free magnetic layer, the pinned magnetic layer, and the tunnel barrier layer using the hard mask pattern as the etch mask to form a magnetic tunnel junction (MTJ) pattern.

13. The method of claim 12, further comprising:
forming a cell gate electrode on or in the substrate before the forming of the etch target layer;
forming dopant regions in the substrate at both sides of the cell gate electrode;
forming an interlayer insulating layer covering the cell gate electrode and the dopant regions; and
forming a contact penetrating the interlayer insulating layer, the contact connected to at least one of the dopant regions,
wherein the etch target layer is formed on the contact.

14. The method of claim 11, wherein the forming of the etch target layer comprises:
forming a dielectric layer and a conductive layer which are sequentially stacked, and
wherein the etching of the etch target layer comprises: etching the conductive layer and the dielectric layer using the hard mask pattern as the etch mask to form a gate structure.

15. The method of claim 14, further comprising:
forming gate spacers on both sidewalls of the gate structure; and
forming source/drain regions in the substrate at both sides of the gate structure.

16. A method for manufacturing a semiconductor device, the method comprising:
forming an etch target layer on a substrate, the etch target layer comprising a free magnetic layer, a pinned magnetic layer, and a tunnel barrier layer disposed between the free and pinned magnetic layers;
forming a hard mask pattern on the etch target layer by:
forming a hard mask layer on the etch target layer,
forming a photoresist pattern on the hard mask layer,
forming an oxidized portion in an upper portion of a region of the hard mask layer by using the photoresist pattern as a mask, and
patterning the hard mask layer using the oxidized portion as an etch mask; and
etching the etch target layer using the hard mask pattern as an etch mask to form a plurality of magnetic tunnel junction (MTJ) patterns from the free magnetic layer, the pinned magnetic layer, and the tunnel barrier layer.

17. The method of claim 16, wherein forming the hard mask pattern is performed in a temperature range of about 20° C. to about 275° C.

18. The method of claim 16, wherein the photoresist pattern comprises at least one hole formed to expose a corresponding region of the hard mask layer, the at least one hole comprising an inner sidewall,
the method further comprising forming a spacer on the inner sidewall of the opening.

19. The method of claim 18, wherein forming the oxidized portion in the upper portion of the region of the hard mask layer comprises forming the oxidized portion in the region of the hard mask layer exposed by the at least one hole.

20. The method of claim 19, wherein forming the oxidized portion in the region of the hard mask layer exposed by the at least one hole comprises performing an oxygen ion implantation process on the region.

* * * * *